United States Patent
Irie

(10) Patent No.: US 9,868,270 B2
(45) Date of Patent: Jan. 16, 2018

(54) WAVELENGTH CONVERTING MEMBER

(71) Applicant: Covalent Materials Corporation, Shinagawa-ku, Tokyo (JP)

(72) Inventor: Masaki Irie, Hadano (JP)

(73) Assignee: COORSTEK KK, Tokyo (JP)

(*) Notice: Subject to any disclaimer, the term of this patent is extended or adjusted under 35 U.S.C. 154(b) by 164 days.

(21) Appl. No.: 14/635,689

(22) Filed: Mar. 2, 2015

(65) Prior Publication Data
US 2015/0247618 A1   Sep. 3, 2015

(30) Foreign Application Priority Data

Mar. 3, 2014 (JP) ................ 2014-040688
Jan. 23, 2015 (JP) ................ 2015-010967
Feb. 10, 2015 (JP) ................ 2015-023992

(51) Int. Cl.
*B32B 18/00* (2006.01)
*C04B 35/115* (2006.01)
(Continued)

(52) U.S. Cl.
CPC ............ *B32B 18/00* (2013.01); *C04B 35/115* (2013.01); *C04B 35/117* (2013.01);
(Continued)

(58) Field of Classification Search
CPC ....... B32B 18/00; C03C 12/00; C03C 14/004; C03C 14/006; C03C 3/125; C04B 35/101;
(Continued)

(56) References Cited

U.S. PATENT DOCUMENTS

2004/0145308 A1* 7/2004 Rossner ............... C04B 35/44
                                                    313/512
2009/0212697 A1* 8/2009 Nakamura ........... B82Y 30/00
                                                    313/506
(Continued)

FOREIGN PATENT DOCUMENTS

JP   2010-157637 A   7/2010
JP   2011-168627 A   9/2011
(Continued)

OTHER PUBLICATIONS

Machine translation of JP2011-168627A, published Sep. 1, 2011.*
(Continued)

*Primary Examiner* — Monique Jackson
(74) *Attorney, Agent, or Firm* — Buchanan, Ingersoll & Rooney PC

(57) ABSTRACT

Provided is a wavelength converting member made of a sintered body which inhibits color unevenness of exit light after wavelength conversion and has excellent light emitting efficiency and inhibited decrease in mechanical strength. The wavelength converting member includes a plate-like sintered body having one principal surface as a light entrance surface and the other principal surface as a light exit surface, and a porosity of 0.1% or less with fluorescent material grains containing an activator and light-transmitting material grains, the entrance surface and the exit surface are sintered surfaces in which the fluorescent material grains and light-transmitting material grains are exposed without processing. The sintered surface has an average roughness Ra of 0.1 μm to 0.5 μm, the fluorescent material grains exposed on a surface have an average roughness Ra1 of 0.2 nm to 0.5 nm, and the light-transmitting material grains exposed on a surface have an average roughness Ra2 of 0.3 nm to 0.7 nm.

9 Claims, 3 Drawing Sheets

(51) Int. Cl.
*C04B 35/117* (2006.01)
*H01L 33/50* (2010.01)
*C09K 11/77* (2006.01)

(52) U.S. Cl.
CPC .. *C09K 11/7774* (2013.01); *C04B 2235/3217* (2013.01); *C04B 2235/3224* (2013.01); *C04B 2235/3225* (2013.01); *C04B 2235/3229* (2013.01); *C04B 2235/3286* (2013.01); *C04B 2235/5436* (2013.01); *C04B 2235/5445* (2013.01); *C04B 2235/6581* (2013.01); *C04B 2235/764* (2013.01); *C04B 2235/77* (2013.01); *C04B 2235/783* (2013.01); *C04B 2235/786* (2013.01); *C04B 2235/96* (2013.01); *C04B 2235/963* (2013.01); *C04B 2237/343* (2013.01); *C04B 2237/704* (2013.01); *H01L 33/505* (2013.01)

(58) Field of Classification Search
CPC . C04B 35/1015; C04B 35/115; C04B 35/117; C04B 35/803; C04B 2235/963; C04B 35/44; C04B 35/62625; C04B 35/62655; C04B 2235/3225; C04B 2235/3229; C04B 2235/5445; C04B 2235/602; C04B 2235/604; C04B 2235/6581; C04B 2235/77; C04B 2235/9653; C04B 2235/9661; C04B 2235/3217; C04B 2235/3224; C04B 2235/3286; C04B 2235/5436; C04B 2235/764; C04B 2235/783; C04B 2235/786; C04B 2235/96; C04B 2237/343; C04B 2237/704; H01L 33/50; H01L 33/505

See application file for complete search history.

(56) References Cited

U.S. PATENT DOCUMENTS

| | | | |
|---|---|---|---|
| 2011/0006329 A1* | 1/2011 | Fujita | C03C 3/19 257/98 |
| 2011/0210658 A1* | 9/2011 | Pan | B32B 18/00 313/112 |
| 2012/0045634 A1* | 2/2012 | Irie | C04B 35/115 428/220 |
| 2012/0068213 A1* | 3/2012 | Zhang | B32B 18/00 257/98 |
| 2013/0320384 A1 | 12/2013 | Liepold et al. | |
| 2015/0329777 A1* | 11/2015 | Hoppe | C04B 35/115 428/220 |

FOREIGN PATENT DOCUMENTS

| | | |
|---|---|---|
| JP | 5083211 B2 | 11/2012 |
| JP | 2014-504807 A | 2/2014 |

OTHER PUBLICATIONS

Office Action issued by the Korean Patent Office in corresponding Korean Patent Application No. 10-2015-0029100 dated Jan. 18, 2016 (4 pages).

\* cited by examiner

WAVELENGTH CONVERTING MEMBER

BACKGROUND OF THE INVENTION

Field of the Invention

The present invention relates to a wavelength converting member which is used with a light emitting element like light emitting diode (LED) and laser diode (LD).

Description of the Related Art

From the viewpoint of saving electric power, having long lifetime and small size, or the like, LED is applied for a cellular phone or various display devices. Further, in accordance with an improvement of light emitting efficiency in recent years, attention is drawn to its use in lighting application, and thus it is quite rapidly spreading.

At present, a main mode of white LED lighting employs a method of obtaining white light by mixing light emission by blue LED with exit light from a fluorophore which receives the incident light of the blue light and emits yellow color as a complementary color of blue color. As a wavelength converting member in which such fluorophore is used, those having fluorophore powders dispersed in a resin have been generally used. However, from the viewpoint of heat resistance, a composite of ceramics is widely used in recent years.

However, in an LED lighting required to have even emission color, the wavelength converting member based on the aforementioned composite of ceramics has a problem that it easily yields color unevenness.

In this regard, in JP 2010-157637 A, for example, a wavelength converting member having a member surface which has been processed to have irregularities to scatter, by reflection or refraction in random direction, the secondary light after wavelength conversion for resolving unevenness in luminance and unevenness in color is disclosed.

Specifically, it is described that, according to a wet etching treatment of a sintered body of inorganic materials and a fluorophore to have a configuration in which fluorophore grains are dissolved preferentially, random irregularities are formed on a surface, and the fluorophore grains are separated from the surface, the scattering property of the secondary light can be enhanced.

Further, as a conventional fluorophore which emits yellow light by receiving blue light used for white LED lighting, a YAG (yttrium•aluminum•garnet)-based fluorophore containing Ce (cerium) is known, for example. When the YAG-based fluorophore is illuminated with blue light, the illuminated blue light and the fluorescent color emitted from the YAG-based fluorophore are admixed with each other, and thus white color can be obtained.

However, in the wavelength converting member having a surface roughened by an etching treatment described in JP 2010-157637A, an etching rate difference exists between the fluorophore grains and inorganic substances. As such, a surface layer mainly composed of the inorganic substances is formed in accordance with dissolving of the fluorophore grains.

Accordingly, an uneven distribution in concentration of the fluorophore grains occurs within a surface of the wavelength converting member, and thus it cannot be said that there is a sufficient improvement of color unevenness of the light emitted from the surface.

Furthermore, there is a technical problem that, according to erosion of the fluorophore grains caused by the etching treatment, the crystallinity of the surface layer of fluorophore grains is lowered and sufficient light emitting efficiency is not obtained.

There is also a technical problem that, due to severe irregularities on the surface of the inorganic substances, the mechanical strength is poor so that cracks may easily occur during mounting or use.

SUMMARY OF THE INVENTION

The present invention is devised to solve the aforementioned technical problems, and an object thereof is to provide a wavelength converting member which can inhibit color unevenness of exit light and has excellent light emitting efficiency and inhibited decrease in mechanical strength.

In order to solve the aforementioned technical problems, according to the present invention, there is provided a wavelength converting member comprises a plate-like sintered body having one principal surface as a light entrance surface and the other principal surface opposite to the entrance surface as a light exit surface, wherein the plate-like sintered body has a porosity of 1.0% or less which has fluorescent material grains containing an activator and light-transmitting material grains, at least the entrance surface and the exit surface are a sintered surface in which the fluorescent material grains and light-transmitting material grains are exposed without processing, and the sintered surface has a calculated average roughness Ra, as an average of 10 points measured with a measurement length of 4 mm, of 0.1 µm to 0.5 µm, and the fluorescent material grains exposed on a surface have a calculated average roughness Ra1, as an average of 20 points measured with a measurement length of 1 µm, of 0.2 nm to 0.5 nm, and the light-transmitting material grains exposed on a surface have a calculated average roughness Ra2, as an average of 20 points measured with a measurement length of 1 µm, of 0.3 nm to 0.7 nm.

According to the wavelength converting member of the present invention, color unevenness of the exit light can be inhibited, excellent light emitting efficiency can be obtained, and a decrease in mechanical strength can be inhibited.

As described herein, it is preferable that an average diameter d1 of the 20 fluorescent material grains be 0.5 µm to 5 µm, an average diameter d2 of the 20 light-transmitting material grains be 1 µm to 10 µm, an occupying ratio of the fluorescent material grains be 22 volume % to 35 volume %, and an occupying ratio of the light transmitting material grains be 65 volume % to 78 volume %.

By having such constitution, it is possible to obtain a wavelength converting member which has even less color unevenness and even higher light emitting efficiency.

Furthermore, it is preferable that the average diameter d1 of the 20 fluorescent material grains be 0.1 times to 0.78 times smaller than the average diameter d2 of the 20 light-transmitting material grains.

By having such constitution, it is possible to obtain a wavelength converting member which has even less color unevenness.

Furthermore, it is preferable that the calculated average roughness Ra2 of the light-transmitting material grains exposed on a surface, which is obtained as an average of 20 points measured with a measurement length of 1 µm, be 1.2 times to 2.0 times larger than the calculated average roughness Ra1 of the fluorescent material grains exposed on a surface, which is obtained as an average of 20 points measured with a measurement length of 1 µm.

By having such constitution, it is possible to obtain a wavelength converting member having a sintered body which has even higher light emitting efficiency.

Furthermore, it is preferable that the fluorescent material be a material represented by the general formula $A_3B_5O_{12}$:Ce (in the formula, A is at least one selected from Y, Gd, Tb, Yb and Lu and B is at least one selected from Al, Ga and Sc) and the light-transmitting material be $Al_2O_3$ or a material in which at least one selected from $Sc_2O_3$ and $Ga_2O_3$ is contained in $Al_2O_3$.

By using those materials, the wavelength converting member can be produced more efficiently and the wavelength converting member made of a sintered body can be produced with higher reliability.

Meanwhile, the wavelength converting member may consist of a single compound or may include therein a layer for inhibiting activator diffusion (intermediate layer) or a carrier layer.

Further, the wavelength converting member according to the present invention having in the inside a layer for inhibiting activator diffusion (intermediate layer) includes a first layer having a YAG-based fluorescent material containing an activator and $Al_2O_3$, an intermediate layer which is laminated on the first layer and has $Al_2O_3$ in which grains with a diameter of 20 μm to 300 μm correspond to 90% or more of total grain number, and a second layer which is laminated on the intermediate layer and has a YAG-based material containing an activator in an amount of no more than 10% of the activator content in the first layer and $Al_2O_3$, in which it has a connected structure in which $Al_2O_3$ grains are connected to each other in each layer and $Al_2O_3$ grains are also connected to each other at each layer interface, all of the first layer, the intermediate layer, and the second layer are a sintered body having a porosity of 1.0% or less, surfaces of the first layer and the second layer are a sintered surface that is exposed without processing, the calculated average roughness Ra as an average of 10 points measured with a measurement length of 4 mm is 0.1 μm to 0.5 μm, the calculated average roughness Ra1 of the YAG-based fluorescent material grains exposed on a surface, which is obtained as an average of 20 points measured with a measurement length of 1 μm, is 0.2 nm to 0.5 nm, and the calculated average roughness Ra2 of $Al_2O_3$ grains exposed on a surface, which is obtained as an average of 20 points measured with a measurement length of 1 μm, is 0.3 nm to 0.7 nm.

According to the wavelength converting member of the present invention, color unevenness of the exit light can be inhibited, excellent light emitting efficiency can be obtained, and a decrease in mechanical strength can be inhibited. In addition, as described above, by having a wavelength converting member with an intermediate layer disposed between a first layer which contains a YAG-based fluorescent material containing an activator and a second layer which contains a YAG-based material, diffusion of the activator from the first layer to the second layer is inhibited by the intermediate layer so that a high heat radiating property is obtained and light with desired color can be emitted at even higher light emitting efficiency and also a wavelength converting member with high toughness can be provided.

As described herein, it is preferable that an average diameter d1 of 20 of the YAG-based fluorescent material grains containing an activator in the first layer and the YAG-based material grains in the second layer be 0.5 μm to 5 μm and an average diameter d2 of the 20 $Al_2O_3$ grains in each of the first layer and the second layer is 1 μm to 10 μm, an occupying ratio of the YAG-based fluorescent material grains containing an activator in the first layer and the YAG-based material grains in the second layer be 22 volume % to 35 volume % in each of the first layer and the second layer, respectively, and an occupying ratio of the $Al_2O_3$ grains in each of the first and the second layer be 65 volume % to 78 volume %, respectively.

As the grain diameter and the content volume ratio are set as described above, the exit light can have a good scattering property and viewing angle dependency of the exit light can be further lowered. Further, the in-plane color unevenness of the exit light accompanying uneven distribution of the YAG-based fluorescent material in the first layer can be further lowered, in particular.

Furthermore, it is preferable that the average diameter d1 of the 20 YAG-based fluorescent material grains containing an activator in the first layer and the YAG-based material grains in the second layer be 0.1 times to 0.78 times smaller than the average diameter d2 of the 20 $Al_2O_3$ grains.

By having such constitution, it is possible to obtain a wavelength converting member made of a sintered body which has even less color unevenness.

Furthermore, it is preferable that the calculated average roughness Ra2 of the $Al_2O_3$ grains exposed on a surface, which is obtained as an average of 20 points measured with a measurement length of 1 μm, be 1.2 times to 2.0 times larger than the calculated average roughness Ra1 of the YAG-based fluorescent material grains exposed on a surface and containing an activator in the first layer and the YAG-based material grains in the second layer, which is obtained as an average of 20 points measured with a measurement length of 1 μm.

By having such constitution, it is possible to obtain a wavelength converting member made of a sintered body which has even higher light emitting efficiency.

Furthermore, it is more preferable that, when the volume composition ratio of the YAG-based fluorescent material containing an activator in the first layer is "a" compared to 100 as a total, "a" be 22 to 35, and when the volume composition ratio of the YAG-based material in the second layer is "b" compared to 100 as a total, "b" be 25 to 40. "b" is more preferably greater than "a".

When the second layer of the wavelength converting member is disposed on a top surface of the light emitting element and it is used such that blue light is illuminated from the light emitting element, the blue light released from the light emitting element is diffused more in the second layer having high volume composition ratio of the YAG-based material, and when illuminated on the first layer, the blue light is in a more evenly diffused state so that heat generation accompanying locally uneven illumination can be suppressed and the light emitting efficiency can be further improved.

Furthermore, it is preferable that the YAG-based fluorescent material containing an activator, which is contained in the first layer, be $(Y_{1-s}Gd_s)_3(Al_{1-t}Ga_t)_5O_{12}$:Ce ($0 \le s \le 0.33$, $0 \le t \le 0.2$).

With the YAG-based fluorescent material, the wavelength converting member made of the sintered body can be produced with reliability and the aforementioned effect of the present invention can be obtained at more significant level.

According to the present invention, the wavelength converting member made of the sintered body, which has inhibited color unevenness of exit light, excellent light emitting efficiency and lowered decrease in mechanical strength, can be obtained.

Thus, the wavelength converting member according to the present invention can be suitably used for a light emitting device using LED or LD, and it is particularly suitable for obtaining stably white light emission from white LED lighting without having color unevenness.

Furthermore, according to the present invention, by additionally having a wavelength converting member with an intermediate layer disposed between a first layer which contains a YAG-based fluorescent material containing an activator and a second layer which contains a YAG-based material, diffusion of the activator from the first layer to the second layer is inhibited by the intermediate layer so that a high heat radiating property is obtained and light with desired color can be emitted at even higher light emitting efficiency and also a wavelength converting member with high toughness can be obtained.

DESCRIPTION OF THE PREFERRED EMBODIMENTS

Hereinbelow, the first embodiment of the present invention is described in detail in view of FIG. 1.

Figure 1:
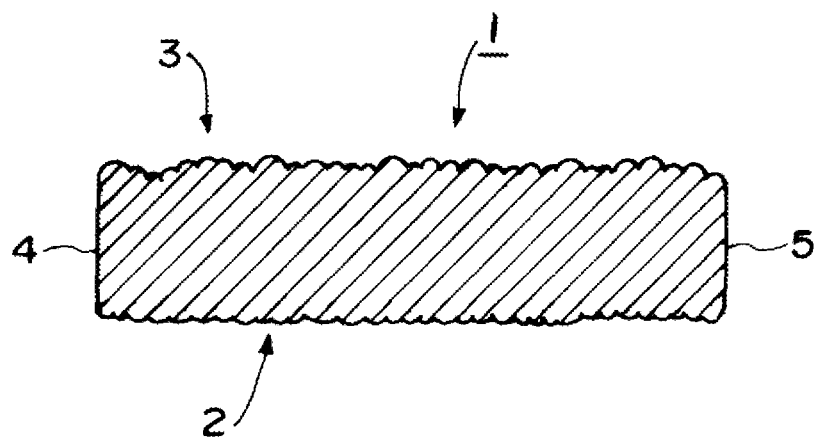
FIG. 1 is a brief cross-sectional view of a wavelength converting member of a first embodiment according to the present invention.

FIG. 1 illustrates a cross-sectional view of the wavelength converting member according to the present invention. As illustrated in FIG. 1, the wavelength converting member made of a plate-like sintered body 1 according to the present invention has one principal surface as a light entrance surface 2 and the other principal surface opposite to the entrance surface 2 as a light exit surface 3.

The plate-like sintered body 1 has a porosity of 1.0% or less which has fluorescent material grains containing an activator and light-transmitting material grains.

When the porosity is more than 1.0%, there is a problem that not only the mechanical strength is lowered but also the light emitting efficiency is lowered due to increased ratio of the returned light to the entrance surface 2 as caused by excessive scattering. In order to solve these problems and obtain a good scattering property of exit light and reduce color unevenness, the porosity is preferably from 0.1% to 1.0%.

Furthermore, when white light emission is to be obtained according to combination of a blue light emitting element or the like, it is preferable that the fluorescent material to be used be a material represented by the general formula $A_3B_5O_{12}$:Ce (in the formula, A is at least one selected from Y, Gd, Tb, Yb and Lu and B is at least one selected from Al, Ga and Sc) and the light-transmitting material to be used be $Al_2O_3$ or a material in which at least one selected from $Sc_2O_3$ and $Ga_2O_3$ is contained in $Al_2O_3$.

Furthermore, the entrance surface 2 and the exit surface 3 are prepared as a sintered surface in which the fluorescent material grains and light-transmitting material grains are exposed without processing.

The sintered surface indicates a surface resulted from performing sintering after molding of raw material powder, and it indicates a surface which has experienced no processing like mechanical grinding and etching after sintering. When the entrance surface 2 and the exit surface 3 are prepared as a so-called processed surface by performing processing like mechanical grinding and etching after sintering, the mechanical strength is lowered and cracks may easily occur during mounting or use as caused by thermal stress. Furthermore, as becoming a reason for defects which occur during processing, there may be a problem of having lower light emitting efficiency.

Thus, the entrance surface 2 and the exit surface 3 are preferably prepared as a sintered surface.

On the other hand, because four lateral surfaces other than the entrance surface 2 and the exit surface 3 (in FIG. 1, two lateral surfaces 4 and 5) have a thickness between lateral surfaces (height length and width length), even when they are prepared as a processed surface, a decrease in mechanical strength hardly occurs. As such, an occurrence of cracks caused by thermal stress during mounting or use hardly occurs. Furthermore, as a decrease in light emitting efficiency to be a reason of the defects which occur during processing hardly occurs, it can be also prepared as a processed surface. In addition, to carry out the adhesion or sintering adhesion to a light emitting element with higher accuracy, the four lateral surfaces are preferably subjected to a processing like mechanical grinding.

Furthermore, the sintered surface on which the fluorescent material grains and light-transmitting material grains are exposed without processing has the calculated average roughness Ra of 0.1 μm to 0.5 μm as an average of 10 points measured with a measurement length of 4 mm.

Ra of 0.1 μm to 0.5 μm as an average of 10 points measured with a measurement length of 4 mm specifies the macroscopic irregular state of the surface, and it is obtained by measuring the calculated average roughness Ra at 10 points with a measurement length of 4 mm on any position of the entrance surface 2 and the exit surface 3 followed by calculation of an average value therefrom.

When Ra is less than 0.1 μm, reflection is high on the exit surface 3 to lower the light emitting efficiency, and therefore undesirable. On the other hand, when Ra is more than 0.5 μm, a thickness deviation is high between the entrance surface 2 and the exit surface 3, which face each other, and uneven luminous intensity is yielded from the exit surface 3, and therefore undesirable.

The four lateral surfaces other than the entrance surface 2 and the exit surface 3 (in FIG. 1, two lateral surfaces 4 and 5) preferably have the calculated average roughness Ra of 0.5 μm or more as an average of 10 points with a measurement length of 4 μm to enhance the adhesiveness to a sealing resin.

The fluorescent material grains exposed on a surface have the calculated average roughness Ra1 of 0.2 nm to 0.5 nm as an average of 20 points measured with a measurement length of 1 μm, and the light-transmitting material grains exposed on a surface have the calculated average roughness Ra2 of 0.3 nm to 0.7 nm as an average of 20 points measured with a measurement length of 1 μm.

The calculated average roughness Ra1 of the fluorescent material grains exposed on a surface and the calculated average roughness Ra2 of the light-transmitting material grains exposed on a surface are to specify the irregular state of each of the fluorescent material grains and light-transmitting material grains that are exposed on a surface, and they are obtained by measuring the calculated average roughness Ra of each grain with a measurement length of 1 µm followed by calculation of an average value from 20 grains.

Having the calculated average roughness Ra1 of the fluorescent material grains to be less than 0.2 nm and the calculated average roughness Ra2 of the light-transmitting material grains to be less than 0.3 nm are not desirable in that, as the production is difficult, and productivity is poor.

Furthermore, when the calculated average roughness Ra1 of the fluorescent material grains is higher than 0.5 nm and the calculated average roughness Ra2 of the light-transmitting material grains is higher than 0.7 nm, crystallinity is deteriorated so that many crystal defects are yielded. As a result, the light emitting efficiency is lowered, and therefore undesirable.

Furthermore, the average diameter d1 of 20 fluorescent material grains is 0.5 µm to 5 µm and the average diameter d2 of 20 light-transmitting material grains is 1 µm to 10 µm.

The average diameter d1 of 20 fluorescent material grains and the average diameter d2 of 20 light-transmitting material grains indicate a value obtained by measuring the longest diameter and the shortest diameter for each of any one grain by microscopic measurement of any cross-section of the wavelength converting member, obtaining an average value of them, and performing the same process twenty times followed by calculation of their average value.

Furthermore, the occupying ratio of the fluorescent material grains is 22 volume % to 35 volume % and the occupying ratio of the light-transmitting material grains is 65 volume % to 78 volume %.

As described above, when the average diameter of the fluorescent material grains and the light-transmitting grains is within the aforementioned range, and content volume ratio is 22 volume % to 35 volume % for the fluorescent material grains and 65 volume % to 78 volume % for the light-transmitting material grains, the light-transmitting material grains function as a major light guide for the light with specific wavelength which is illuminated by a light source (LED element) and light with specific wavelength which is absorbed and emitted by the fluorescent material grains. As a result, a wavelength converting member having even less color unevenness and higher light emitting efficiency is obtained.

Furthermore, the average diameter d1 of the 20 fluorescent material grains is 0.1 times to 0.78 times smaller than the average diameter d2 of the 20 light-transmitting material grains.

When the average diameter d1 of the 20 fluorescent material grains is 0.1 times to 0.78 times smaller than the average diameter d2 of the 20 light-transmitting material grains, the color unevenness can be further reduced.

Furthermore, the calculated average roughness Ra2 of the light-transmitting material grains exposed on a surface, which is obtained as an average of 20 points measured with a measurement length of 1 µm, is 1.2 times to 2.0 times larger than the calculated average roughness Ra1 of the fluorescent material grains exposed on a surface, which is obtained as an average of 20 points measured with a measurement length of 1 µm.

As the light-transmitting grains is a major light guide, when the calculated average roughness of the light-transmitting material grains that are exposed at least on the exit surface 3 of the wavelength converting member made of the plate-like sintered body 1 is prepared to be rougher by the aforementioned ratio than the fluorescent material grains, light of two specific wavelengths, that is, the light with specific wavelength which is illuminated by a light source (LED element), and light with specific wavelength which is absorbed and emitted by the fluorescent material grains can be more effectively provided as exit light, and thus higher light emitting efficiency can be obtained.

Meanwhile, the surface shape of a wavelength converting member made of a plate-like sintered body described above can be measured by using an atomic force microscope (Dimension 5000 manufactured by Digital Instruments) and a silicon cantilever, and scanning of the surface shape of each sample is made.

Furthermore, the fluorescent material is a material represented by the general formula $A_3B_5O_{12}$:Ce (in the formula, A is at least one selected from Y, Gd, Tb, Yb and Lu and B is at least one selected from Al, Ga and Sc) and the light-transmitting material is $Al_2O_3$ or a material in which at least one selected from $Sc_2O_3$ and $Ga_2O_3$ is contained in $Al_2O_3$.

By using each material described above, the effect of the wavelength converting member can be obtained with higher reliability.

More preferred material is a material in which the activator is Ce, the fluorescent material is composed of $Y_3Al_5O_{12}$, and the light-transmitting material is composed of $Al_2O_3$.

Furthermore, for producing a wavelength converting member made of a plate-like sintered body from the compositional materials described above, it is preferable to use any one in which the average grain diameter is as follows; $Y_2O_3$ material: 0.3 µm to 2 µm, $CeO_2$ material: 0.1 µm to 1 µm and $Al_2O_3$ material: 0.1 µm to 0.8 µm, and to perform the sintering in vacuum atmosphere with medium vacuum to low vacuum like $1.0 \times 10^{-2}$ Pa or higher.

Accordingly, the wavelength converting member according to the present invention can be produced with higher efficiency and reliability. Meanwhile, the molding method, sintering method or the like for producing a sintered body is not particularly limited.

Figure 2:
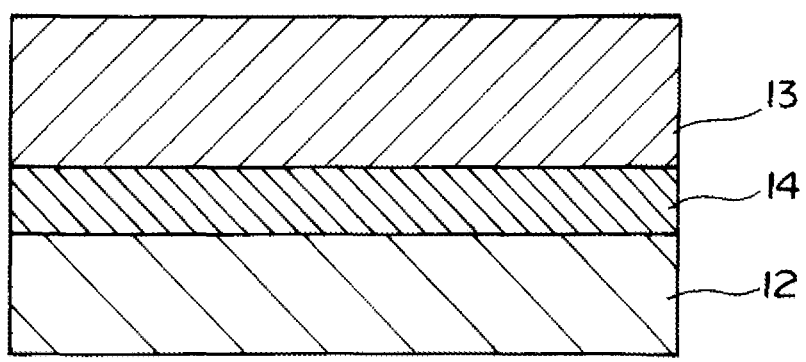
FIG. 2 is a cross-sectional view of a wavelength converting member of a second embodiment according to the present invention.
Figure 3:
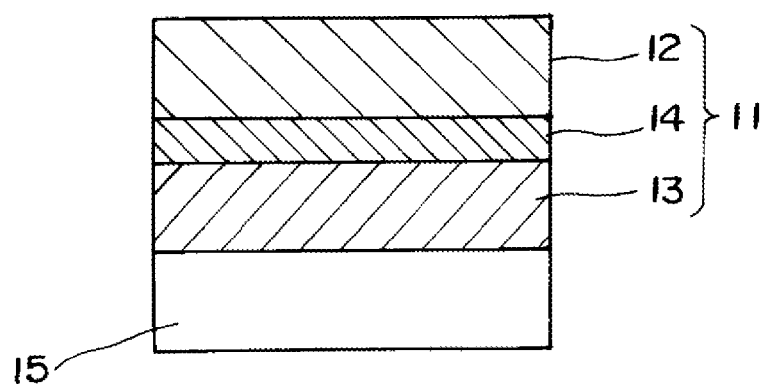
FIG. 3 is a cross-sectional view illustrating a state in which the wavelength converting member of the second embodiment of FIG. 2 is disposed on a light emitting element.

Next, the second embodiment of the present invention is described in detail in view of FIGS. 2 and 3.

Firstly, note that with regard to the second embodiment of the present invention, there is other related art in addition to the above-described related art, and it is described herein.

In JP 2014-504807 W, a semiconductor chip using the aforementioned fluorophore is suggested. The semiconductor chip disclosed in JP 2014-504807 W is mounted, for example, on an optoelectronic device, and used. Specifically, as illustrated in FIG. 4, an optoelectronic device 50 has a semiconductor chip 52 disposed on a device casing 51 as a heat sink and it is designed such that heat from the semiconductor chip 52 is released through the device casing 51.

Figure 4:
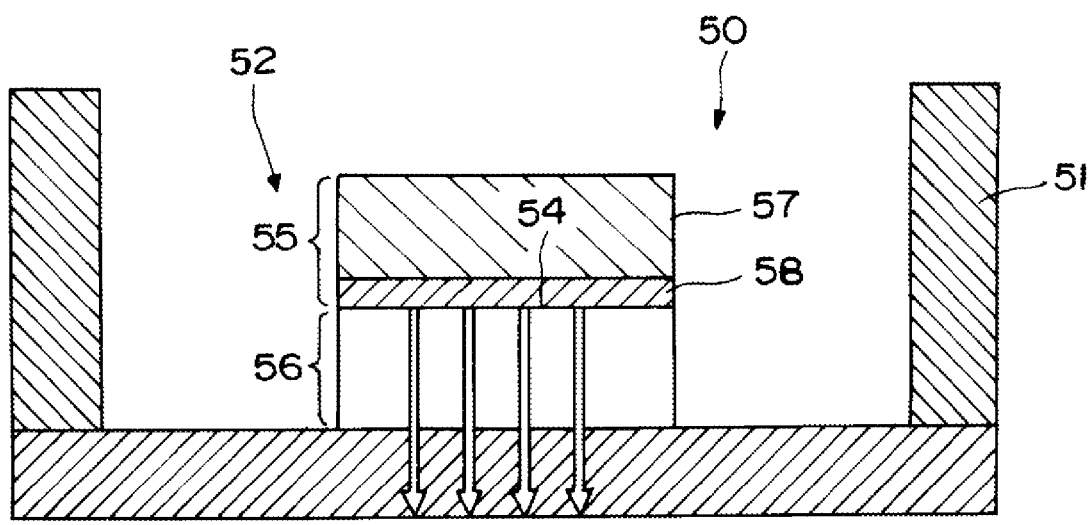
FIG. 4 is a cross-sectional view of an electronics device of a relate art.

The semiconductor chip 52 is provided with a ceramic conversion element 55, which is disposed on top of the beam output surface 54 of a semiconductor body 56 as illustrated in FIG. 4. The ceramic conversion element 55 includes, for example, an active layer 58 composed of YAG:Ce-based garnet fluorophore and a carrier layer 57 disposed above the active layer. Meanwhile, the arrow in FIG. 4 indicates the heat release direction.

Further, when descriptions are given for the active layer 58 and the carrier layer 57, the active layer 58 is composed of a fluorophore material (YAG:Ce, for example) doped with an activator (Ce, for example), and it has a function of converting light in a predetermined wavelength range to light in other wavelength range. Further, the carrier layer 57 is composed of a fluorophore material (YAG, for example) not containing an activator.

Figure 5:
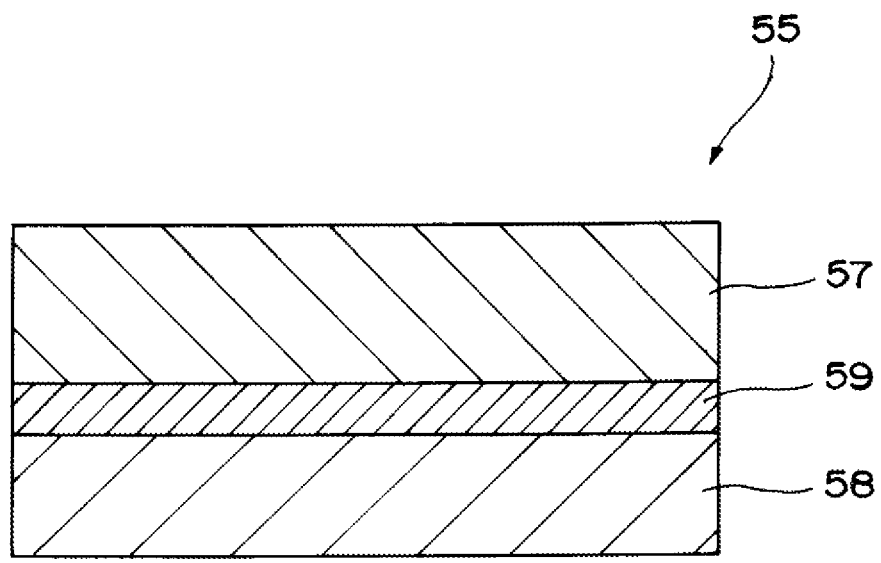
FIG. 5 is a cross-sectional view of a wavelength converting element equipped in the electronics device of FIG. 4.

Further, with regard to the ceramic conversion element 55, it is suggested in JP 2014-504807 W to have an inhibition layer 59 disposed between the active layer 58 and the carrier layer 57 in order to inhibit diffusion of the activator (Ce) from the active layer 58 to inside of the carrier layer 57 as illustrated in FIG. 5. The inhibition layer 59 is composed of aluminum oxide, for example.

For producing the ceramic conversion element 55, a green sheet to become each layer of the active layer 58 and the carrier layer 57 is formed by using ceramic powder, a binder, and additives followed by lamination and sintering. Accordingly, a ceramic conversion element in which they are connected to each other can be produced.

Similarly, for producing the ceramic conversion element 55 provided with the inhibition layer 59, a green sheet to become each layer of the active layer 58, the carrier layer 57, and the inhibition layer 59 is formed by using ceramic powder, a binder, and additives followed by lamination and sintering. Accordingly, the ceramic conversion element in which they are connected to each other can be produced.

However, as a result of evaluating and studying, in various ways, the ceramic conversion element (wavelength converting member) provided with an inhibition layer which is described in JP 2014-504807 W, it was found that there are technical problems to be solved as described below.

Firstly, the inhibition layer of the ceramic conversion element which is obtained by laminating and sintering each layer (active layer, inhibition layer, and carrier layer) described in JP 2014-504807 W does not fully function, and thus there is a problem that diffusion is not sufficiently lowered due to diffusion of the activator from the active layer to the carrier layer. In particular, when the Ce concentration in the carrier layer is more than 40 wt % of the Ce concentration in the active layer, the carrier layer also has an activating (fluorescent) function, and thus it was difficult to obtain the color desired for the light emitted from the carrier layer.

Secondly, when the active layer is composed of YAG:Ce and the inhibition layer is composed of $Al_2O_3$, there is a high difference in refractive index between the active layer and the inhibition layer. As such, the amount of reflected incident light from a semiconductor body is high at an interface between the active layer and the inhibition layer, and it was found that there is a technical problem of having lowered light emitting efficiency as caused by increased returned light.

Thirdly, as the active layer and the carrier layer are composed of a YAG material only, the strength is low and, due to a difference in thermal expansion coefficient of $Al_2O_3$ in the inhibition layer which is interposed between the active layer and the carrier layer, it was found that there is a technical problem of having an easy occurrence of cracks at each interface as caused by thermal stress.

Fourthly, as the active layer is composed of a YAG material only, thermal conductivity is low, and as the heat generated from a semiconductor body is easily localized in the active layer, it was found that there is a technical problem that the light emitting efficiency is lowered.

Meanwhile, it is suggested in JP 2014-504807 W that $Al_2O_3$ grains are incorporated as a scattering agent in the carrier layer. However, none of the aforementioned problems can be effectively solved by it.

To solve the first to the fourth technical problems described above, inventors of the present invention also conducted intensive studies on a ceramic conversion element (wavelength converting member) which is obtained by laminating and sintering each layer (active layer, inhibition layer, and carrier layer) disclosed in JP 2014-504807 W.

As a result, it was found that, when the diameter of $Al_2O_3$ in an intermediate layer (inhibition layer) composed of $Al_2O_3$ is within a specific range, both a first layer (active layer) and a second layer (carrier layer) are prepared to be a layer composed of a YAG-based fluorescent material and $Al_2O_3$, and a connected structure is formed in which $Al_2O_3$ grains are connected to each other within each layer and at interface of each layer, the aforementioned first to fourth technical problems can be solved. The present invention is completed accordingly.

In accordance with the second embodiment of the present invention, there can be provided a wavelength converting member in which color unevenness of exit light can be inhibited and excellent light emitting efficiency and inhibited decrease in mechanical strength can be obtained. Further, by having the wavelength converting member with an intermediate layer disposed between a first layer which contains a YAG-based fluorescent material containing an activator and a second layer which contains a YAG-based material, diffusion of the activator from the first layer to the second layer is inhibited by the intermediate layer so that a high heat radiating property is obtained and light with desired color can be emitted at even higher light emitting efficiency and also a wavelength converting member with high toughness can be provided.

FIG. 2 is a cross-sectional view of the wavelength converting member 11 made of a sintered body according to the present invention.

As illustrated in FIG. 2, a wavelength converting member 11 consists of a first layer 12 for performing wavelength conversion, an intermediate layer 14 laminated on top of the first layer 12, and a second layer 13 laminated on top of the intermediate layer 14 to become a carrier layer of LED (light emitting diode) or LD (laser diode). Namely, the wavelength converting member 11 is formed as a laminated composite for wavelength conversion.

The first layer 12 is disposed on top of the beam exit surface of LED (light emitting diode) or LD (laser diode). Namely, according to the wavelength converting member 11 (laminated composite for wavelength conversion), light with predetermined wavelength which has entered from LED or LD is released as exit light after conversion to a different wavelength in the first layer 12.

The first layer 12 has a function of converting wavelength, that is, converting part of excited light (with specific wavelength) from LED (light emitting diode) or LD (laser diode) to a longer wavelength and transmitting it.

Specifically, it is a layer composed of a YAG-based fluorescent material (for example, YAG:Ce) containing an activator (for example, Ce) and $Al_2O_3$. The layer having a function of converting wavelength like the first layer 12 can have controlled wavelength or the like for converting excited light (hue design) depending on composition of the fluorescent material base, type and content of the activator, and the thickness of the layer, or the like.

More specifically, the YAG-based fluorescent material containing an activator is preferably $(Y_{1-s}Gd_s)_3(Al_{1-t}Ga_t)_5O_{12}$:Ce, with the proviso that $0 \leq s \leq 0.33$, $0 \leq t \leq 0.2$. With such YAG-based fluorescent material, the wavelength converting member 11 (laminated composite for wavelength conversion) can be produced with higher reliability and also the effect of the invention described below can be obtained at more significant level.

Furthermore, the intermediate layer 14 composed of $Al_2O_3$ is formed between the first layer 12 and the second layer 13. The intermediate layer 14 is to inhibit diffusion of the activator in the first layer 12 to the second layer 13 in the sintering process, on the occasion of sintering and integration after green sheets to become each of the layers 12 to 14 are laminated in order when the wavelength converting member 11 is produced.

Namely, when the activator contained in the first layer 12 diffuses into the second layer 13, the content of the activator in the first layer 12 is lowered than the desired amount, yielding a problem of having an inappropriate wavelength conversion. Furthermore, as the second layer 13 is doped with an activator, part of the excited light is also converted in the second layer 13, and as a result, a problem arises in that, as a whole, the chromaticity of the exit light cannot be obtained as designed. To solve those problems, the intermediate layer 14 is formed.

Furthermore, the intermediate layer 14 is constituted such that it is formed of $Al_2O_3$ and the number of grains of the $Al_2O_3$ having the diameter of 20 μm to 300 μm is 90% or more of the total grain number of the $Al_2O_3$.

When sintering is made such that the number of grains of the $Al_2O_3$ having the diameter of 20 μm to 300 μm is 90% or more of the total grain number of the $Al_2O_3$ after completion of the step of sintering a green sheet laminate, diffusion from the first layer 12 to the second layer 13 can be sufficiently reduced. Furthermore, diffusion of an activator can be also inhibited during a step of film formation after sintering or re-heating for adhesion, or the like.

Furthermore, the grain diameter of $Al_2O_3$ for forming the intermediate layer 14 is more preferably 5 μm to 500 μm. With this grain diameter of $Al_2O_3$, diffusion of the activator can be more effectively inhibited and also a decrease in mechanical strength accompanying the increased grain size can be inhibited.

The porosity of the intermediate layer 14 is more preferably 1.0% or less and pores of 0.3 μm to 3 μm are evenly distributed. Accordingly, cracks caused by thermal stress can be prevented with higher reliability. To obtain this effect with higher certainty, the porosity is preferably 0.1% to 1.0%.

Furthermore, the second layer 13 is composed of the same material as that of the first layer 12 except the presence or absence of an activator. Specifically, it is composed of a YAG-based material in which the activator content is 10% or less than the activator content of the first layer 12 and $Al_2O_3$.

By forming the second layer 13 as described above, warpage of the composite accompanied with heat generation from an LED element or an LD element at the time of using the wavelength converting member 11 (laminated composite for wavelength conversion) as an LED lamp or an LD lamp can be inhibited.

Furthermore, the volume composition ratio between the YAG-based material and $Al_2O_3$ in the first layer 12 is as follows: the YAG-based fluorescent material is in the range of 22 volume % to 35 volume % and $Al_2O_3$ is in the range of 65 volume % to 78 volume %.

Furthermore, the volume composition ratio between the YAG-based material and $Al_2O_3$ in the second layer 13 is as follows: the YAG-based fluorescent material is in the range of 22 volume % to 35 volume % and $Al_2O_3$ is in the range of 65 volume % to 78 volume %.

Furthermore, $Al_2O_3$ grains are connected to each other in each layer of the first layer 12, the second layer 13 and the intermediate layer 14, and $Al_2O_3$ grains are also connected to each other at an interface of each layer 12, 13, and 14.

In other words, the wavelength converting member 11 (laminated composite for wavelength conversion) has a structure in which the intermediate layer 14 composed of $Al_2O_3$ is sandwiched between the first layer 12 and the second layer 13 having the composition ratio described above. Furthermore, the aforementioned three layers have a structure in which $Al_2O_3$ grains are connected to each other, and $Al_2O_3$ grains have a connected structure even at an interface of each layer.

In particular, because each of the first layer 12 and the second layer 13 contains $Al_2O_3$ at a predetermined composition ratio, they have sufficient strength and an occurrence of cracks caused by thermal stress at the time of use, which is caused by a difference in thermal expansion coefficient between each layer, can be inhibited. To further reduce the occurrence of cracks, it is preferable that the volume composition ratio of $Al_2O_3$ in the first layer 12 and the second layer 13 be prepared to be even within a range of ±5 volume %. Since the heat radiating property from the first layer 12 is also improved, a decrease in light emitting efficiency due to heat localization can be also inhibited. It is also possible to have an excellent heat radiating property for a heat sink like an LED package.

Furthermore, as it has a connected structure in which $Al_2O_3$ grains are connected to each other at an interface of each layer 12, 13, and 14, the interface light reflection amount caused by a difference in refractive index between each layer can be reduced, and as a result, a decrease in the light emitting efficiency can be inhibited. Furthermore, as it has a connected structure in which $Al_2O_3$ grains are connected to each other, a decrease in heat generation efficiency caused by heat localization in the first layer 12 can be also inhibited. It is also possible to enhance a heat radiating property for a device casing as a heat sink.

Meanwhile, when the "volume composition ratio of the YAG-based fluorescent material contained in the first layer 12 (volume %)×thickness (μm)" is A (volume %·μm) and the "volume composition ratio of the YAG-based material contained in the second layer 13 (volume %)×thickness (μm)" is B (volume %·μm), A/B is more preferably 0.024 to 5. By satisfying other conditions and also forming them within this range, the warpage which occurs during use can be more certainly reduced. To further enhance this effect, the A/B is more preferably 0.083 to 0.360.

Furthermore, the average grain diameter of the YAG-based fluorescent material contained in the first layer 12 and the YAG-based material contained in the second layer 13 is 0.5 μm to 5 μm and the average grain diameter of $Al_2O_3$ contained in the first layer 12 and the second layer 13 is 1 μm to 10 μm.

By setting the grain diameter to above value, a good scattering property of exit light can be obtained so that not only the color unevenness within a viewing angle can be reduced more but also the in-plane color unevenness of exit light caused by uneven distribution of the YAG-based fluorescent material in the first layer can be further reduced, in particular.

Furthermore, it is more preferable that, when the volume composition ratio of the YAG-based fluorescent material containing activator in the first layer 12 is "a", "a" be 22 to 35, and when the volume composition ratio of the YAG-based material in the second layer 13 is "b", "b" be 25 to 40. "b" is more preferably greater than "a".

As illustrated in FIG. 3, when the wavelength converting member (laminated composite for wavelength conversion) is used such that the second layer 13 is disposed on top of the light emitting element 15 and blue light is illuminated from the light emitting element, the blue light released from the light emitting element is diffused more in the second layer 13 which has higher volume composition ratio of a YAG-based material. When it is illuminated on the first layer 12, the blue light is in a more evenly distributed state so that heat generation caused by uneven local illumination can be inhibited and the light emitting efficiency can be further enhanced.

Meanwhile, also in the second embodiment, surfaces of the first layer 12 and the second layer 13 are a sintered surface which is exposed without processing like those described for the first embodiment, and they are formed such that the calculated average roughness Ra, which is obtained as an average of 10 points measured with a measurement length of 4 mm, is 0.1 µm to 0.5 µm, the calculated average roughness Ra1 of the YAG-based fluorescent material grains and YAG-based material exposed on a surface, which is obtained as an average of 20 points measured with a measurement length of 1 µm, is 0.2 nm to 0.5 nm, and the calculated average roughness Ra2 of $Al_2O_3$ grains exposed on a surface, which is obtained as an average of 20 points measured with a measurement length of 1 µm, is 0.3 nm to 0.7 nm.

EXAMPLES

Hereinbelow, the present invention is described more specifically based on the examples, but the present invention is not limited to them.
(Preparation of Sintered Body Sample of $Y_3Al_5O_{12}$:Ce+$Al_2O_3$)

Cerium oxide powder having an average grain diameter of 0.5 µm and purity of 99.9%, yttrium oxide powder having an average grain diameter of 1.2 µm and purity of 99.9%, and aluminum oxide powder having an average grain diameter of 0.4 µm and purity of 99.9% were admixed with one another at predetermined blending ratio to obtain a raw material powder.

To the raw material powder, ethanol, a polyvinyl butyral (PVB)-based binder, and a glycerin-based plasticizer were added, and by performing pulverizing mixing for 40 hours with a ball mill which uses an aluminum oxide ball, a slurry was prepared.

By using this slurry and a doctor blade method, a green sheet with predetermined thickness was formed. The obtained green sheet was degreased and calcined in air and then sintered in a vacuum atmosphere of $1.0\times10^{-2}$ Pa or lower to prepare a sintered body of $Y_3Al_5O_{12}$:Ce+$Al_2O_3$ (Example 1).

Meanwhile, the porosity of the sintered body of $Y_3Al_5O_{12}$:Ce+$Al_2O_3$, the calculated average roughness from 10 points measured with a measurement length of 4 mm on a sintered surface, the calculated average roughness from 20 points measured with a measurement length of 1 µm in the fluorescent material grains and light-transmitting material grains, and the average diameter of 20 fluorescent material grains and 20 light-transmitting material grains were prepared to have those described in Table 1 by suitably modifying the sintering temperature in the range of 1500° C. to 1750° C. and also modifying the average grain diameter of the $Y_2O_3$ material, $CeO_2$ material, and $Al_2O_3$ material within the aforementioned numerical range (Examples 2 to 18 and Comparative Examples 1 to 2).

Furthermore, for Comparative Example 3, the sintered body of $Y_3Al_5O_{12}$:Ce+$Al_2O_3$ was prepared according to the same conditions as Example 11, and then a mirror surface processing of the entrance surface and exit surface was performed by using 3 µm diamond slurry.

Furthermore, for Comparative Example 4, the sintered body of $Y_3Al_5O_{12}$:Ce+$Al_2O_3$ was prepared according to the same conditions as Example 14, and then a grinding processing of the entrance surface and exit surface was performed by using #200 (mesh) fixed abrasive grains and a surface grinding processing machine.

Furthermore, for Comparative Example 5, the sintered body of $Y_3Al_5O_{12}$:Ce+$Al_2O_3$ was prepared according to the same conditions as Example 15, and then an etching processing of the entrance surface and exit surface was performed by using hot conc. sulfuric acid (25% $H_2SO_4$, 150° C.)

The aforementioned Examples 1 to 18 and Comparative Examples 1 to 5 are described in Tables 1 and 2.
(Preparation of Sintered Body Sample of $Y_2Gd_1Al_5O_{12}$:Ce+$Al_2O_3$)

Cerium oxide powder having an average grain diameter of 0.5 µm and purity of 99.9%, yttrium oxide powder having an average grain diameter of 1.2 µm and purity of 99.9%, gadolinium oxide powder having an average grain diameter of 0.5 µm and purity of 99.9%, and aluminum oxide powder having an average grain diameter of 0.4 µm and purity of 99.9% were admixed with one another at predetermined blending ratio to obtain a raw material powder.

To the raw material powder, ethanol, a polyvinyl butyral (PVB)-based binder, and a glycerin-based plasticizer were added, and by performing pulverizing mixing for 40 hours with a ball mill which uses an aluminum oxide ball, a slurry was prepared.

By using this slurry and a doctor blade method, a green sheet with predetermined thickness was formed. The obtained green sheet was degreased and calcined in air and then sintered in a vacuum atmosphere of $1.0\times10^{-2}$ Pa or lower to prepare a sintered body of $Y_2Gd_1Al_5O_{12}$:Ce+$Al_2O_3$ (Example 19).

Then, a sintered body according to Examples 19 to 36 and Comparative Examples 6 to 10 was obtained. Examples 19 to 36 and Comparative Examples 6 and 10 are described in Tables 3 and 4.

Meanwhile, modification of each property value of Examples 20 to 36 and Comparative Examples 6 and 7 was performed in the same manner as the sintered body of $Y_3Al_5O_{12}$:Ce+$Al_2O_3$ described above. For Comparative Example 8 (sintered body of $Y_2Gd_1Al_5O_{12}$:Ce+$Al_2O_3$ equivalent to Example 31), Comparative Example 9 (sintered body of $Y_2Gd_1Al_5O_{12}$:Ce+$Al_2O_3$ equivalent to Example 36), and Comparative Example 10 (sintered body of $Y_2Gd_1Al_5O_{12}$:Ce+$Al_2O_3$ equivalent to Example 25), a mirror surface processing, a grinding processing, and an etching processing were performed according to the same conditions as Comparative Examples 3, 4, and 5.
(Preparation of Sintered Body Sample of $Lu_3Al_5O_{12}$:Ce+$Al_2O_3$)

Cerium oxide powder having an average grain diameter of 0.5 µm and purity of 99.9%, lutetium oxide powder having an average grain diameter of 1.7 µm and purity of 99.9%, and aluminum oxide powder having an average grain diameter of 0.4 µm and purity of 99.9% were admixed with one another at predetermined blending ratio to obtain a raw material powder.

To the raw material powder, ethanol, a polyvinyl butyral (PVB)-based binder, and a glycerin-based plasticizer were added, and by performing pulverizing mixing for 40 hours with a ball mill which uses an aluminum oxide ball, a slurry was prepared.

By using this slurry and a doctor blade method, a green sheet with predetermined thickness was formed. The obtained green sheet was degreased and calcined in air and then sintered in a vacuum atmosphere of $1.0 \times 10^{-2}$ Pa or lower to prepare a sintered body of $Lu_2Al_5O_{12}:Ce+Al_2O_3$ (Example 37). Meanwhile, Example 37 is described in Tables 5 and 6.

(Preparation of Sintered Body Sample of $Y_3Ga_1Al_4O_{12}:Ce+Al_2O_3$)

Cerium oxide powder having an average grain diameter of 0.5 μm and purity of 99.9%, yttrium oxide powder having an average grain diameter of 1.2 μm and purity of 99.9%, gallium oxide powder having an average grain diameter of 2 μm and purity of 99.9%, and aluminum oxide powder having an average grain diameter of 0.4 μm and purity of 99.9% were admixed with one another at predetermined blending ratio to obtain a raw material powder.

To the raw material powder, ethanol, a polyvinyl butyral (PVB)-based binder, and a glycerin-based plasticizer were added, and by performing pulverizing mixing for 40 hours with a ball mill which uses an aluminum oxide ball, a slurry was prepared.

By using this slurry and a doctor blade method, a green sheet with predetermined thickness was formed. The obtained green sheet was degreased and calcined in air, and then sintered in a vacuum atmosphere of $1.0 \times 10^{-2}$ or lower Pa to prepare a sintered body of $Y_3Ga_1Al_4O_{12}:Ce+Al_2O_3$ (Example 38). Meanwhile, Example 38 is described in Tables 5 and 6.

(Preparation of Sintered Body Sample of $Lu_3Sc_1Al_4O_{12}:Ce+Al_2O_3$)

Cerium oxide powder having an average grain diameter of 0.5 μm and purity of 99.9%, lutetium oxide powder having an average grain diameter of 1.7 μm and purity of 99.9%, scandium oxide powder having an average grain diameter of 0.3 μm and purity of 99.9%, and aluminum oxide powder having an average grain diameter of 0.4 μm and purity of 99.9% were admixed with one another at predetermined blending ratio to obtain a raw material powder.

To the raw material powder, ethanol, a polyvinyl butyral (PVB)-based binder, and a glycerin-based plasticizer were added, and by performing pulverizing mixing for 40 hours with a ball mill which uses an aluminum oxide ball, a slurry was prepared.

By using this slurry and a doctor blade method, a green sheet with predetermined thickness was formed. The obtained green sheet was degreased and calcined in air, and then sintered in a vacuum atmosphere of $1.0 \times 10^{-2}$ Pa or lower to prepare a sintered body of $Lu_3Sc_1Al_4O_{12}:Ce+Al_2O_3$ (Example 39). Meanwhile, Example 39 is described in Tables 5 and 6.

(Preparation of Sintered Body Sample of $Lu_3Ga_1Al_4O_{12}:Ce+Al_2O_3$)

Cerium oxide powder having an average grain diameter of 0.5 μm and purity of 99.9%, lutetium oxide powder having an average grain diameter of 1.2 μm, an average grain diameter of 1.7 μm and purity of 99.9%, gallium oxide powder having an average grain diameter of 2 μm and purity of 99.9%, and aluminum oxide powder having an average grain diameter of 0.4 μm and purity of 99.9% were admixed with one another at predetermined blending ratio to obtain a raw material powder.

To the raw material powder, ethanol, a polyvinyl butyral (PVB)-based binder, and a glycerin-based plasticizer were added, and by performing pulverizing mixing for 40 hours with a ball mill which uses an aluminum oxide ball, a slurry was prepared.

By using this slurry and a doctor blade method, a green sheet with predetermined thickness was formed. The obtained green sheet was degreased and calcined in air, and then sintered in a vacuum atmosphere of $1.0 \times 10^{-2}$ Pa or lower to prepare a sintered body of $Lu_3Ga_1Al_4O_{12}:Ce+Al_2O_3$ (Example 40). Meanwhile, Example 40 is described in Tables 5 and 6.

(Preparation of Sintered Body Sample of $Y_3Sc_1Al_4O_{12}:Ce+Al_2O_3$)

Cerium oxide powder having an average grain diameter of 0.5 μm and purity of 99.9%, yttrium oxide powder having an average grain diameter of 1.2 μm and purity of 99.9%, scandium oxide powder having an average grain diameter of 0.3 μm and purity of 99.9%, and aluminum oxide powder having an average grain diameter of 0.4 μm and purity of 99.9% were admixed with one another at predetermined blending ratio to obtain a raw material powder.

To the raw material powder, ethanol, a polyvinyl butyral (PVB)-based binder, and a glycerin-based plasticizer were added, and by performing pulverizing mixing for 40 hours with a ball mill which uses an aluminum oxide ball, a slurry was prepared.

By using this slurry and a doctor blade method, a green sheet with predetermined thickness was formed. The obtained green sheet was degreased and calcined in air, and then sintered in a vacuum atmosphere of $1.0 \times 10^{-2}$ Pa or lower to prepare a sintered body of $Y_3Sc_1Al_4O_{12}:Ce+Al_2O_3$ (Example 41). Meanwhile, Example 41 is described in Tables 5 and 6.

(Preparation of Sintered Body Sample of $Tb_3Al_5O_{12}:Ce+Al_2O_3$)

Cerium oxide powder having an average grain diameter of 0.5 μm and purity of 99.9%, terbium oxide powder having an average grain diameter of 0.7 μm and purity of 99.9%, and aluminum oxide powder having an average grain diameter of 0.4 μm and purity of 99.9% were admixed with one another at predetermined blending ratio to obtain a raw material powder.

To the raw material powder, ethanol, a polyvinyl butyral (PVB)-based binder, and a glycerin-based plasticizer were added, and by performing pulverizing mixing for 40 hours with a ball mill which uses an aluminum oxide ball, a slurry was prepared.

By using this slurry and a doctor blade method, a green sheet with predetermined thickness was formed. The obtained green sheet was degreased and calcined in air, and then sintered in a vacuum atmosphere of $1.0 \times 10^{-2}$ Pa or lower to prepare a sintered body of $Tb_3Al_5O_{12}:Ce+Al_2O_3$ (Example 42). Meanwhile, Example 42 is described in Tables 5 and 6.

(Preparation of Sintered Body Sample of $Yb_3Al_5O_{12}:Ce+Al_2O_3$)

Cerium oxide powder having an average grain diameter of 0.5 μm and purity of 99.9%, ytterbium oxide powder having an average grain diameter of 0.4 μm and purity of 99.9%, and aluminum oxide powder having an average grain diameter of 0.4 μm and purity of 99.9% were admixed with one another at predetermined blending ratio to obtain a raw material powder.

To the raw material powder, ethanol, a polyvinyl butyral (PVB)-based binder, and a glycerin-based plasticizer were added, and by performing pulverizing mixing for 40 hours with a ball mill which uses an aluminum oxide ball, a slurry was prepared.

By using this slurry and a doctor blade method, a green sheet with predetermined thickness was formed. The obtained green sheet was degreased and calcined in air, and then sintered in a vacuum atmosphere of $1.0 \times 10^{-2}$ Pa or lower to prepare a sintered body of $Yb_3Al_5O_{12}$:Ce+$Al_2O_3$ (Example 43). Meanwhile, Example 43 is described in Tables 5 and 6.

Meanwhile, modification of each property value of Examples 37 to 43 was performed in the same manner as the sintered body of $Y_3Al_5O_{12}$:Ce+$Al_2O_3$ described above. For the sintered body of Examples 1 to 43 and Comparative Examples 1 to 10, the four lateral surfaces other than the entrance surface 2 and the exit surface 3 were subjected to a grinding processing which uses #150 (mesh) fixed abrasive grains and a surface grinding processing machine. The calculated average roughness Ra, which is an average of 20 points measured with a measurement length of 100 μm, was in the range of 0.5 μm to 1.5 μm for all lateral surfaces.

Measurement of Each Example and Each Comparative Example

For each Example and each Comparative Example, the porosity, the calculated average roughness Ra1 and Ra2 averaged from 20 points, mean surface roughness Ra of the entrance surface and exit surface, the content ratio of the fluorescent material and light-transmitting material, the average diameter d1 of 20 fluorescent material grains, the average diameter d2 of 20 light-transmitting material grains, light emitting efficiency, and light emission unevenness were measured.

The porosity was measured according to the Archimedes' method (JIS C 2141).

Furthermore, the calculated average roughness Ra1 and Ra2 as a 20-point average of $Y_3Al_5O_{12}$:Ce grains and $Al_2O_3$ grains that are exposed on a surface were measured by using a cantilever with spring constant of 3 N/m and resonance frequency of 75 kHz (silicon cantilever) and an atomic force microscope (Dimension 5000 manufactured by Digital Instruments) at AC mode (tapping mode) and scanning the surface shape of each sample.

For the measurement, scanning was made with 10 μm square which is the maximum range of a standard scanner. After that, narrowing (enlarging) of the viewing area was performed to reflect the characteristics of surface shape. Calculation of calculated average roughness was performed at a measurement length of 1 μm. From the measured Ra1 and Ra2, Ra2/Ra1 was obtained.

Furthermore, the calculated average roughness Ra on the entrance surface and the exit surface was measured with a measurement length of 4 μm by using a contact type device for measuring surface roughness (JIS B0601-2001).

Furthermore, for the measurement of the content ratio of the fluorescent material and the light-transmitting material, a sample with a varying mixing amount of raw material powder relating to the fluorescent material and raw material powder relating to the light-transmitting material is measured by powder X-ray diffraction analysis and the calibration curve was established based on the peak intensity ratio between the fluorescent material and the light-transmitting material. After that, the measurement sample was measured and the ratio of the fluorescent material and the light-transmitting material was calculated.

With regard to the average diameter d1 of 20 fluorescent material grains and the average diameter d2 of 20 light-transmitting material grains, a fluorescent material phase and a light-transmitting material phase were identified based on a reflected electron image of FE-SEM and then grain diameter was measured for each. Meanwhile, the grain diameter of single grain was obtained by measuring the longest length and the shortest length and dividing them by 2.

Furthermore, for measurement of the light emitting efficiency, processing was made to have a size of 1 mm×1 mm and thickness of 0.1 mm followed by fixing on a blue LED element (light emitting area: 1 mm×1 mm, light emission wavelength of 460 nm) using a silicone resin. Emitted light was collected using an integrating sphere and a light emission spectrum was measured by using a spectrophotometer ("USB4000 Fiber Multichannel Spectrophotometer" manufactured by Ocean Optics, Inc.).

From the obtained spectrum, light emission peak wavelength and light emission intensity standardized against absorption amount were calculated. For the light emission intensity, the result obtained by measuring commercially available YAG:Ce fluorophore ("P46-Y3" manufactured by Kasei Optonix, Ltd.) was set at 100.

For measurement of the light emission unevenness, processing was made to have a size of 1 mm×1 mm and thickness of 0.1 mm followed by illuminating from a rear surface blue LED light which has been collected at diameter of 0.3 mm and light was collected from the front side by using a spectrophotometer ("USB4000 Fiber Multichannel Spectrophotometer" manufactured by Ocean Optics, Inc.).

From the spectrum data obtained therefrom, CIEx was calculated. The values shown in the table indicate a standard deviation when measurement was made for 51×51 (2601 points) in an area of 5 mm×5 mm with 0.1 mm pitch.

The measurement results are expressed in Tables 1 to 6.

TABLE 1

| | Porosity (%) | Surface state | Average surface roughness of 20 YAG: Ce grains: Ra1 (nm/1 μm length) | Average surface roughness of 20 $Al_2O_3$ grains: Ra2 (nm/1 μm length) | Average surface roughness from 10 points in entire sintered compact: Ra (μm/4 mm length) | Ra2/Ra1 | Fluorescent material Material | Content ratio vol. % | Light-transmitting material Material | Content ratio vol. % |
|---|---|---|---|---|---|---|---|---|---|---|
| Comparative Example 1 | 2.1 | Sintered surface | 0.70 | 0.70 | 1.0 | 1.00 | $Y_3Al_5O_{12}$:Ce | 28 | $Al_2O_3$ | 72 |
| Example 1 | 0.5 | Sintered surface | 0.20 | 0.30 | 0.1 | 1.50 | $Y_3Al_5O_{12}$:Ce | 28 | $Al_2O_3$ | 72 |
| Example 2 | 0.8 | Sintered surface | 0.30 | 0.40 | 0.2 | 1.33 | $Y_3Al_5O_{12}$:Ce | 28 | $Al_2O_3$ | 72 |
| Example 3 | 1.0 | Sintered surface | 0.50 | 0.70 | 0.5 | 1.40 | $Y_3Al_5O_{12}$:Ce | 28 | $Al_2O_3$ | 72 |
| Comparative Example 2 | 1.0 | Sintered surface | 0.70 | 0.90 | 0.7 | 1.29 | $Y_3Al_5O_{12}$:Ce | 28 | $Al_2O_3$ | 72 |

TABLE 1-continued

|  | Porosity (%) | Surface state | Average surface roughness of 20 YAG: Ce grains: Ra1 (nm/1 μm length) | Average surface roughness of 20 Al$_2$O$_3$ grains: Ra2 (nm/1 μm length) | Average surface roughness from 10 points in entire sintered compact: Ra (μm/4 mm length) | Ra2/Ra1 | Fluorescent material Material | Content ratio vol. % | Light-transmitting material Material | Content ratio vol. % |
|---|---|---|---|---|---|---|---|---|---|---|
| Example 4 | 0.8 | Sintered surface | 0.30 | 0.40 | 0.2 | 1.33 | Y$_3$Al$_5$O$_{12}$:Ce | 20 | Al$_2$O$_3$ | 80 |
| Example 5 | 0.8 | Sintered surface | 0.30 | 0.40 | 0.2 | 1.33 | Y$_3$Al$_5$O$_{12}$:Ce | 22 | Al$_2$O$_3$ | 78 |
| Example 6 | 0.8 | Sintered surface | 0.30 | 0.40 | 0.2 | 1.33 | Y$_3$Al$_5$O$_{12}$:Ce | 28 | Al$_2$O$_3$ | 72 |
| Example 7 | 0.8 | Sintered surface | 0.30 | 0.40 | 0.2 | 1.33 | Y$_3$Al$_5$O$_{12}$:Ce | 35 | Al$_2$O$_3$ | 65 |
| Example 8 | 0.8 | Sintered surface | 0.30 | 0.40 | 0.2 | 1.33 | Y$_3$Al$_5$O$_{12}$:Ce | 40 | Al$_2$O$_3$ | 60 |
| Example 9 | 0.1 | Sintered surface | 0.30 | 0.40 | 0.2 | 1.33 | Y$_3$Al$_5$O$_{12}$:Ce | 28 | Al$_2$O$_3$ | 72 |
| Example 10 | 0.8 | Sintered surface | 0.30 | 0.40 | 0.2 | 1.33 | Y$_3$Al$_5$O$_{12}$:Ce | 28 | Al$_2$O$_3$ | 72 |
| Example 11 | 0.8 | Sintered surface | 0.30 | 0.40 | 0.2 | 1.33 | Y$_3$Al$_5$O$_{12}$:Ce | 28 | Al$_2$O$_3$ | 72 |
| Example 12 | 0.8 | Sintered surface | 0.30 | 0.40 | 0.2 | 1.33 | Y$_3$Al$_5$O$_{12}$:Ce | 28 | Al$_2$O$_3$ | 72 |
| Example 13 | 0.8 | Sintered surface | 0.30 | 0.40 | 0.2 | 1.33 | Y$_3$Al$_5$O$_{12}$:Ce | 28 | Al$_2$O$_3$ | 72 |
| Example 14 | 0.1 | Sintered surface | 0.40 | 0.40 | 0.2 | 1.00 | Y$_3$Al$_5$O$_{12}$:Ce | 28 | Al$_2$O$_3$ | 72 |
| Example 15 | 0.8 | Sintered surface | 0.25 | 0.30 | 0.2 | 1.20 | Y$_3$Al$_5$O$_{12}$:Ce | 28 | Al$_2$O$_3$ | 72 |
| Example 16 | 0.8 | Sintered surface | 0.25 | 0.40 | 0.2 | 1.60 | Y$_3$Al$_5$O$_{12}$:Ce | 28 | Al$_2$O$_3$ | 72 |
| Example 17 | 0.8 | Sintered surface | 0.20 | 0.40 | 0.2 | 2.00 | Y$_3$Al$_5$O$_{12}$:Ce | 28 | Al$_2$O$_3$ | 72 |
| Example 18 | 0.8 | Sintered surface | 0.19 | 0.40 | 0.2 | 2.10 | Y$_3$Al$_5$O$_{12}$:Ce | 28 | Al$_2$O$_3$ | 72 |
| Comparative Example 3 | 0.8 | Polished surface (mirror surface) | 0.30 | 0.30 | <0.01 | 1.00 | Y$_3$Al$_5$O$_{12}$:Ce | 28 | Al$_2$O$_3$ | 72 |
| Comparative Example 4 | 0.1 | Ground surface | 2.80 | 2.40 | 0.3 | 0.86 | Y$_3$Al$_5$O$_{12}$:Ce | 28 | Al$_2$O$_3$ | 72 |
| Comparative Example 5 | 0.8 | Etching surface | 1.90 | 1.10 | 0.2 | 0.58 | Y$_3$Al$_5$O$_{12}$:Ce | 28 | Al$_2$O$_3$ | 72 |

TABLE 2

|  | Average grain diameter of 20 fluorescent material grains: d1 μm | Average grain diameter of 20 light-emitting material grains: d2 μm | d1/d2 | Light emitting efficiency % | Color unevenness σ(CIE_x) | Mechanical strength MPa |
|---|---|---|---|---|---|---|
| Comparative Example 1 | 0.6 | 1.3 | 0.46 | 77 | 0.0023 | 322 |
| Example 1 | 1.7 | 5.1 | 0.33 | 126 | 0.0005 | 486 |
| Example 2 | 2.1 | 4.9 | 0.43 | 123 | 0.0006 | 431 |
| Example 3 | 1.5 | 6.3 | 0.24 | 127 | 0.0007 | 507 |
| Comparative Example 2 | 0.9 | 4.4 | 0.20 | 75 | 0.0027 | 363 |
| Example 4 | 7.0 | 11.0 | 0.64 | 102 | 0.0009 | 402 |
| Example 5 | 5.0 | 10.0 | 0.38 | 140 | 0.0001 | 407 |
| Example 6 | 2.7 | 4.9 | 0.55 | 131 | 0.0003 | 495 |
| Example 7 | 0.5 | 1.0 | 0.49 | 137 | 0.0004 | 477 |
| Example 8 | 0.2 | 0.5 | 0.40 | 101 | 0.0008 | 491 |
| Example 9 | 1.0 | 1.2 | 0.85 | 102 | 0.0007 | 440 |
| Example 10 | 2.6 | 3.3 | 0.78 | 135 | 0.0000 | 436 |
| Example 11 | 1.5 | 4.1 | 0.37 | 140 | 0.0001 | 582 |
| Example 12 | 1.8 | 18.0 | 0.10 | 132 | 0.0000 | 526 |
| Example 13 | 0.6 | 20.0 | 0.03 | 108 | 0.0008 | 578 |
| Example 14 | 2.4 | 7.9 | 0.30 | 110 | 0.0007 | 416 |
| Example 15 | 5.0 | 10.0 | 0.50 | 152 | 0.0001 | 403 |
| Example 16 | 2.7 | 4.9 | 0.55 | 147 | 0.0001 | 424 |

TABLE 2-continued

|  | Average grain diameter of 20 fluorescent material grains: d1 μm | Average grain diameter of 20 light-emitting material grains: d2 μm | d1/d2 | Light emitting efficiency % | Color unevenness σ(CIE_x) | Mechanical strength MPa |
|---|---|---|---|---|---|---|
| Example 17 | 0.5 | 1.0 | 0.50 | 144 | 0.0000 | 426 |
| Example 18 | 1.4 | 8.3 | 0.17 | 117 | 0.0010 | 457 |
| Comparative Example 3 | 1.1 | 3.3 | 0.33 | 89 | 0.0028 | 324 |
| Comparative Example 4 | 3.9 | 8.7 | 0.45 | 93 | 0.0026 | 348 |
| Comparative Example 5 | 4.5 | 9.6 | 0.47 | 94 | 0.0014 | 370 |

TABLE 3

|  | Porosity (%) | Surface state | Average surface roughness of 20 YAG: Ce grains: Ra1 (nm/1 μm length) | Average surface roughness of 20 $Al_2O_3$ grains: Ra2 (nm/1 μm length) | Average surface roughness from 10 points in entire sintered compact: Ra (μm/4 mm length) | Ra2/Ra1 | Fluorescent material | | Light-transmitting material | |
|---|---|---|---|---|---|---|---|---|---|---|
|  |  |  |  |  |  |  | Material | Content ratio vol. % | Material | Content ratio vol. % |
| Comparative Example 6 | 1.8 | Sintered surface | 0.70 | 0.70 | 1.0 | 1.00 | $Y_2Gd_1Al_5O_{12}$:Ce | 28 | $Al_2O_3$ | 72 |
| Example 19 | 0.7 | Sintered surface | 0.20 | 0.30 | 0.1 | 1.50 | $Y_2Gd_1Al_5O_{12}$:Ce | 28 | $Al_2O_3$ | 72 |
| Example 20 | 0.5 | Sintered surface | 0.40 | 0.50 | 0.2 | 1.25 | $Y_2Gd_1Al_5O_{12}$:Ce | 28 | $Al_2O_3$ | 72 |
| Example 21 | 1.0 | Sintered surface | 0.50 | 0.60 | 0.5 | 1.20 | $Y_2Gd_1Al_5O_{12}$:Ce | 28 | $Al_2O_3$ | 72 |
| Comparative Example 7 | 1.0 | Sintered surface | 0.80 | 1.10 | 0.8 | 1.29 | $Y_2Gd_1Al_5O_{12}$:Ce | 28 | $Al_2O_3$ | 72 |
| Example 22 | 0.5 | Sintered surface | 0.40 | 0.50 | 0.2 | 1.25 | $Y_2Gd_1Al_5O_{12}$:Ce | 21 | $Al_2O_3$ | 80 |
| Example 23 | 0.5 | Sintered surface | 0.40 | 0.50 | 0.2 | 1.25 | $Y_2Gd_1Al_5O_{12}$:Ce | 22 | $Al_2O_3$ | 78 |
| Example 24 | 0.5 | Sintered surface | 0.40 | 0.50 | 0.2 | 1.25 | $Y_2Gd_1Al_5O_{12}$:Ce | 30 | $Al_2O_3$ | 70 |
| Example 25 | 0.5 | Sintered surface | 0.40 | 0.50 | 0.2 | 1.25 | $Y_2Gd_1Al_5O_{12}$:Ce | 35 | $Al_2O_3$ | 65 |
| Example 26 | 0.5 | Sintered surface | 0.40 | 0.50 | 0.2 | 1.25 | $Y_2Gd_1Al_5O_{12}$:Ce | 39 | $Al_2O_3$ | 60 |
| Example 27 | 0.1 | Sintered surface | 0.40 | 0.50 | 0.2 | 1.25 | $Y_2Gd_1Al_5O_{12}$:Ce | 28 | $Al_2O_3$ | 72 |
| Example 28 | 0.5 | Sintered surface | 0.40 | 0.50 | 0.2 | 1.25 | $Y_2Gd_1Al_5O_{12}$:Ce | 28 | $Al_2O_3$ | 72 |
| Example 29 | 0.5 | Sintered surface | 0.40 | 0.50 | 0.2 | 1.25 | $Y_2Gd_1Al_5O_{12}$:Ce | 28 | $Al_2O_3$ | 72 |
| Example 30 | 0.5 | Sintered surface | 0.40 | 0.50 | 0.2 | 1.25 | $Y_2Gd_1Al_5O_{12}$:Ce | 28 | $Al_2O_3$ | 72 |
| Example 31 | 0.5 | Sintered surface | 0.40 | 0.50 | 0.2 | 1.25 | $Y_2Gd_1Al_5O_{12}$:Ce | 28 | $Al_2O_3$ | 72 |
| Example 32 | 0.1 | Sintered surface | 0.50 | 0.50 | 0.2 | 1.00 | $Y_2Gd_1Al_5O_{12}$:Ce | 28 | $Al_2O_3$ | 72 |
| Example 33 | 0.5 | Sintered surface | 0.42 | 0.50 | 0.2 | 1.20 | $Y_2Gd_1Al_5O_{12}$:Ce | 28 | $Al_2O_3$ | 72 |
| Example 34 | 0.5 | Sintered surface | 0.36 | 0.50 | 0.2 | 1.40 | $Y_2Gd_1Al_5O_{12}$:Ce | 28 | $Al_2O_3$ | 72 |
| Example 35 | 0.5 | Sintered surface | 0.25 | 0.50 | 0.2 | 2.00 | $Y_2Gd_1Al_5O_{12}$:Ce | 28 | $Al_2O_3$ | 72 |
| Example 36 | 0.5 | Sintered surface | 0.22 | 0.50 | 0.2 | 2.30 | $Y_2Gd_1Al_5O_{12}$:Ce | 28 | $Al_2O_3$ | 72 |
| Comparative Example 8 | 0.5 | Polished surface (mirror surface) | 0.30 | 0.30 | <0.01 | 1.00 | $Y_2Gd_1Al_5O_{12}$:Ce | 28 | $Al_2O_3$ | 72 |
| Comparative Example 9 | 0.5 | Ground surface | 2.60 | 2.30 | 0.3 | 0.88 | $Y_2Gd_1Al_5O_{12}$:Ce | 28 | $Al_2O_3$ | 72 |
| Comparative Example 10 | 0.5 | Etching surface | 1.70 | 1.50 | 0.2 | 0.88 | $Y_2Gd_1Al_5O_{12}$:Ce | 28 | $Al_2O_3$ | 72 |

TABLE 4

| | Average grain diameter of 20 fluorescent material grains: d1 μm | Average grain diameter of 20 light-emitting material grains: d2 μm | d1/d2 | Light emitting efficiency % | Color unevenness σ(CIE_x) | Mechanical strength MPa |
|---|---|---|---|---|---|---|
| Comparative Example 6 | 0.7 | 1.7 | 0.41 | 92 | 0.0020 | 368 |
| Example 19 | 0.7 | 8.1 | 0.09 | 124 | 0.0006 | 449 |
| Example 20 | 3.0 | 8.1 | 0.37 | 122 | 0.0007 | 577 |
| Example 21 | 2.3 | 2.2 | 1.05 | 130 | 0.0004 | 541 |
| Comparative Example 7 | 2.4 | 9.0 | 0.27 | 98 | 0.0018 | 346 |
| Example 22 | 0.3 | 0.3 | 1.00 | 119 | 0.0008 | 537 |
| Example 23 | 0.5 | 1.0 | 0.50 | 138 | 0.0003 | 559 |
| Example 24 | 2.4 | 5.1 | 0.47 | 132 | 0.0004 | 496 |
| Example 25 | 5.0 | 10.0 | 0.50 | 139 | 0.0001 | 407 |
| Example 26 | 6.5 | 10.9 | 0.60 | 101 | 0.0010 | 411 |
| Example 27 | 2.6 | 3.7 | 0.70 | 117 | 0.0010 | 570 |
| Example 28 | 2.6 | 3.3 | 0.78 | 140 | 0.0001 | 579 |
| Example 29 | 7.8 | 2.0 | 3.90 | 133 | 0.0000 | 575 |
| Example 30 | 0.5 | 5.1 | 0.10 | 137 | 0.0000 | 513 |
| Example 31 | 3.3 | 5.7 | 0.58 | 113 | 0.0010 | 443 |
| Example 32 | 3.3 | 7.4 | 0.45 | 104 | 0.0007 | 443 |
| Example 33 | 2.9 | 1.2 | 2.42 | 146 | 0.0001 | 461 |
| Example 34 | 2.3 | 3.4 | 0.68 | 144 | 0.0001 | 584 |
| Example 35 | 4.2 | 2.7 | 1.56 | 155 | 0.0000 | 483 |
| Example 36 | 2.8 | 4.8 | 0.58 | 106 | 0.0010 | 575 |
| Comparative Example 8 | 2.9 | 5.4 | 0.54 | 99 | 0.0022 | 313 |
| Comparative Example 9 | 2.5 | 4.6 | 0.54 | 71 | 0.0024 | 356 |
| Comparative Example 10 | 4.0 | 9.6 | 0.42 | 100 | 0.0026 | 385 |

TABLE 5

| | Porosity (%) | Surface state | Average surface roughness of 20 YAG: Ce grains: Ra1 (nm/1 μm length) | Average surface roughness of 20 $Al_2O_3$ grains: Ra2 (nm/1 μm length) | Average surface roughness from 10 points in entire sintered compact: Ra (μm/4 mm length) | Ra2/Ra1 |
|---|---|---|---|---|---|---|
| Example 37 | 0.8 | Sintered surface | 0.30 | 0.40 | 0.3 | 1.33 |
| Example 38 | 0.5 | Sintered surface | 0.30 | 0.40 | 0.2 | 1.33 |
| Example 39 | 0.7 | Sintered surface | 0.30 | 0.40 | 0.3 | 1.33 |
| Example 40 | 0.9 | Sintered surface | 0.30 | 0.40 | 0.2 | 1.33 |
| Example 41 | 0.7 | Sintered surface | 0.30 | 0.40 | 0.3 | 1.33 |
| Example 42 | 0.8 | Sintered surface | 0.30 | 0.40 | 0.2 | 1.33 |
| Example 43 | 0.9 | Sintered surface | 0.30 | 0.40 | 0.2 | 1.33 |

| | Fluorescent material | | Light-transmitting material | |
|---|---|---|---|---|
| | Material | Content ratio vol. % | Material | Content ratio vol. % |
| Example 37 | $Lu_3Al_5O_{12}$:Ce | 28 | $Al_2O_3$ | 72 |
| Example 38 | $Y_3Ga_1Al_4O_{12}$:Ce | 28 | $Al_2O_3$, $Ga_2O_3$ | 72 |
| Example 39 | $Lu_3Sc_1Al_4O_{12}$:Ce | 28 | $Al_2O_3$, $Sc_2O_3$ | 72 |
| Example 40 | $Lu_3Ga_1Al_4O_{12}$:Ce | 28 | $Al_2O_3$, $Ga_2O_3$ | 72 |
| Example 41 | $Y_3Sc_1Al_4O_{12}$:Ce | 28 | $Al_2O_3$, $Sc_2O_3$ | 72 |
| Example 42 | $Tb_3Al_5O_{12}$:Ce | 28 | $Al_2O_3$ | 72 |
| Example 43 | $Yb_3Al_5O_{12}$:Ce | 28 | $Al_2O_3$ | 72 |

TABLE 6

| | Average grain diameter of 20 fluorescent material grains: d1 µm | Average grain diameter of 20 light-emitting material grains: d2 µm | d1/d2 | Light emitting efficiency % | Color unevenness σ(CIE_x) | Mechanical strength MPa |
|---|---|---|---|---|---|---|
| Example 37 | 4.4 | 5.3 | 0.83 | 134 | 0.0002 | 471 |
| Example 38 | 2.1 | 6.2 | 0.34 | 138 | 0.0002 | 421 |
| Example 39 | 2.8 | 8.7 | 0.32 | 137 | 0.0003 | 567 |
| Example 40 | 1.4 | 9.6 | 0.15 | 133 | 0.0002 | 446 |
| Example 41 | 1.9 | 3.0 | 0.63 | 137 | 0.0003 | 555 |
| Example 42 | 1.1 | 2.9 | 0.38 | 133 | 0.0002 | 420 |
| Example 43 | 1.2 | 1.9 | 0.63 | 135 | 0.0002 | 571 |

The material for wavelength conversion in which the surface of a sintered body has been subjected to an etching treatment (Comparative Example 5), which is described as an example of a related art, showed low mechanical strength and high color unevenness.

Furthermore, in the case of the material for wavelength conversion for which a grinding treatment is performed instead of the etching treatment (Comparative Example 4), both the mechanical strength and color unevenness were similar to those of Comparative Example 5.

Furthermore, in the case of the material for wavelength conversion for which a polishing treatment was performed (Comparative Example 3) exhibited low light emitting efficiency.

On the other hand, as it can be recognized from Tables 1 and 2, the wavelength converting member made of the sintered body of the present invention (Examples 1 to 3) in which the porosity is 1.0% or less, the calculated average roughness Ra as an average of 10 points measured with a measurement length of 4 mm on a sintered surface is 0.1 µm to 0.5 µm, and the calculated average roughness Ra of the fluorescent material grains and light-transmitting material grains exposed on a surface, which is obtained as an average of 20 points measured with a measurement length of 1 µm, is 0.2 nm to 0.5 nm and 0.3 nm to 0.7 nm, respectively, was confirmed to have higher light emitting efficiency and reduced color unevenness compared to those outside the above range (Comparative Examples 1 and 2).

Furthermore, the wavelength converting member made of the sintered body of the present invention (Examples 5 to 7) in which the average diameter of 20 fluorescent material grains and 20 light-transmitting material grains is d1:0.5 to 5 µm and d2:1 to 10 µm, respectively, and occupying ratio of each grain is 22 to 35 volume % and 65 to 78 volume %, respectively, was confirmed to have higher light emitting efficiency and reduced color unevenness compared to Examples 1 to 3.

Furthermore, the wavelength converting member made of the sintered body of the present invention (Examples 10 to 12) in which the average diameter d1 of 20 fluorescent material grains is 0.1 to 0.78 times smaller than the average diameter d2 of 20 light-transmitting material grains was confirmed to have reduced color unevenness compared to Examples 5 to 7. It was also confirmed to have further improved light emitting efficiency when the calculated average roughness Ra2 of the light-transmitting material grains, which is obtained as an average of 20 points measured with a measurement length of 1 µm, is 1.2 times to 2.0 times larger than the calculated average roughness Rat of the fluorescent material grains, which is obtained as in the same manner as above.

Furthermore, also for the case of using a wavelength converting member in which $Y_2Gd_1Al_5O_{12}$:Ce is used as a fluorescent material of Tables 3 and 4, it was confirmed to exhibit the same result as above $Y_3Al_5O_{12}$:Ce.

Furthermore, also for the case of a wavelength converting member in which $Lu_3Al_5O_{12}$:Ce, $Lu_3Ga_1Al_4O_{12}$:Ce, $Y_3Sc_1Al_4O_{12}$:Ce, $Lu_3Ga_1Al_4O_{12}$:Ce, $Y_3Sc_1Al_4O_{12}$:Ce, $Tb_3Al_5O_{12}$:Ce, or $Yb_3Al_5O_{12}$:Ce is used as a fluorescent material in Tables 5 and 6, it was confirmed to exhibit good light emitting efficiency and small color unevenness.

Hereinbelow, the second embodiment of the present invention is further specifically described based on the examples. However, the present invention is not limited to the examples shown below.

(Production of Green Sheet of First Layer)

The first layer of the second embodiment corresponds to the wavelength converting member of the first embodiment described above.

Specifically, cerium oxide powder having an average grain diameter of 0.3 to 1.5 µm and purity of 99.9%, yttrium oxide powder having an average grain diameter of 0.6 to 5 µm and purity of 99.9%, and aluminum oxide powder having an average grain diameter of 0.2 to 0.9 µm and purity of 99.9% were admixed with one another in a predetermined amount so as to have composition after sintering according to the below-described sintering conditions shown in Table 7. As a result, raw material powder was obtained.

To the raw material powder, ethanol, a polyvinyl butyral (PVB)-based binder, and a glycerin-based plasticizer were added, and by performing pulverizing mixing for 10 hours with a ball mill which uses an aluminum oxide ball, a slurry was prepared.

Then, by using a doctor blade method, a green sheet with predetermined thickness as shown in Table 7 was produced from the obtained slurry. Next, the produced green sheet was subjected to a punching processing to form a rectangular shape with a dimension of 100 mm by 100 mm (100 mm×100 mm).

(Production of Green Sheet of Intermediate Layer)

Aluminum oxide powder having an average grain diameter of 0.3 to 2.1 µm and purity of 99.9% was used as a raw material powder. Selection was made such that the diameter of aluminum oxide grains sintered according to the below-described sintering conditions is within the minimum value and maximum value range shown in Table 8.

To the raw material powder, ethanol, a polyvinyl butyral (PVB)-based binder, and a glycerin-based plasticizer were added, and by performing pulverizing mixing for 10 hours with a ball mill which uses an aluminum oxide ball, a slurry was prepared.

Then, by using a doctor blade method, a green sheet with predetermined thickness as shown in Table 8 was produced from the obtained slurry. Next, the produced green sheet was subjected to a punching processing to form a rectangular shape with a dimension of 100 mm by 100 mm (100 mm×100 mm).

(Production of Green Sheet of Second Layer)

Yttrium oxide powder having an average grain diameter of 0.6 to 5 μm and purity of 99.9% and aluminum oxide powder having an average grain diameter of 0.2 to 0.9 μm and purity of 99.9% were admixed with each other in a predetermined amount so as to have composition after sintering according to the below-described sintering conditions shown in Table 9. As a result, raw material powder was obtained.

To the raw material powder, ethanol, a polyvinyl butyral (PVB)-based binder, and a glycerin-based plasticizer were added, and by performing pulverizing mixing for 10 hours with a ball mill which uses an aluminum oxide ball, a slurry was prepared.

Then, by using a doctor blade method, a green sheet with predetermined thickness as shown in Table 9 was produced from the obtained slurry. Next, the produced green sheet was subjected to a punching processing to form a rectangular shape with a dimension of 100 mm by 100 mm (100 mm×100 mm). (Production of laminated composite for wavelength conversion (wavelength converting member))

After the punching processing of the first layer, intermediate layer, and second layer, the green sheet for intermediate layer was inserted between the green sheet for the first layer and the green sheet for the second layer to yield a laminate of green sheets.

Subsequently, a Warm Isostatic Press (WIP) was performed at an atmosphere of 60° C. and 100 MPa to produce a molded article having a laminated structure.

Thereafter, the produced molded article was degreased and calcined in air, and then sintered in a vacuum atmosphere at 1550 to 1750° C. to obtain a laminated composite for wavelength conversion (wavelength converting member) (Examples 44 to 53 and Comparative Examples 11 to 19).

Measurement and Evaluation of Each Example and Each Comparative Example (Measurement of Porosity and Like)

For each Example and each Comparative Example of the second embodiment of the present invention, the porosity, the calculated average roughness Ra1 and Ra2 averaged from 20 points, mean surface roughness Ra, the average diameter d1 of 20 YAG-based fluorescent material grains, the average diameter d2 of 20 $Al_2O_3$ grains, the content ratio of the YAG-based fluorescent material and $Al_2O_3$, and the content ratio of the YAG-based material and $Al_2O_3$ were measured according to the same method as the method of Examples and Comparative Examples of the first embodiment of the present invention. The results are shown in Tables 7, 8, and 9.

(Presence or Absence of Connection Between $Al_2O_3$ Grains)

For Examples 44 to 53 and Comparative Examples 11 to 19, presence or absence of connection between $Al_2O_3$ grains in each layer and on interface of each layer was verified.

The presence or absence of connection between $Al_2O_3$ grains in each layer and on interface of each layer was verified by observing any vertical cross-section in a thickness direction of a laminated composite for wavelength conversion according to use of SEM (scanning electron microscope) and observing a connection (bonding) between $Al_2O_3$ grains in each layer and on interface of each layer. The results are shown in Table 10.

(Measurement of the Number of $Al_2O_3$ Grains and Grain Diameter of Each)

Any vertical cross-section in a thickness direction of a laminated composite for wavelength conversion was measured according to use of SEM (scanning electron microscope) and the number of $Al_2O_3$ grains and grain diameter of each were measured by taking an image of the intermediate layer part at viewing angle of 1 $mm^2$ in total. The results are shown in Table 8.

(Measurement of Ce Concentration (Atom %) in First Layer and Second Layer after Sintering)

The measurement of the Ce concentration (atom %) in the first layer and the second layer after sintering was performed by ICP spectrophotometric analysis after scraping off each layer by a grinding processing.

(Measurement of Color Unevenness)

For measuring color unevenness, processing was made to have a size of 1 mm×1 mm followed by illuminating from a rear surface blue LED light which has been collected at a diameter of 0.3 mm and light was collected from the front side by using a spectrophotometer ("USB4000 Fiber Multichannel Spectrophotometer" manufactured by Ocean Optics, Inc.).

From the spectrum data obtained therefrom, CIEx was calculated. The values shown in Table 5 indicate standard deviation when measurement was made for 51×51 (2601 points) in an area of 5 mm×5 mm with 0.1 mm pitch.

(Measurement of Chromaticity (Fluorescent Peak Wavelength) and Light Emitting Efficiency)

For measurement of the chromaticity and light emitting efficiency, processing was made to have a size of 1 mm×1 mm followed by fixing on a blue LED element (light emitting area: 1 mm×1 mm, light emission wavelength of 460 nm) using a silicone resin. Emitted light was collected using an integrating sphere and a light emission spectrum was measured by using a spectrophotometer ("USB4000 Fiber Multichannel Spectrophotometer" manufactured by Ocean Optics, Inc.).

From the obtained spectrum, the fluorescent peak wavelength was measured and light emission intensity standardized against the absorption amount was calculated. The fluorescent peak wavelength shifted to a short wavelength region as Ce is diffused in the second layer. In order to obtain desired white light (8000 K or less) in combination with blue light, it is necessary that the light emitting peak intensity is 540 nm or higher.

For the light emission intensity (light emitting efficiency), the result obtained by measuring commercially available YAG:Ce fluorophore ("P46-Y3" manufactured by Kasei Optonix, Ltd.) was set at 100.

TABLE 7

| | | | First layer | | | | |
|---|---|---|---|---|---|---|---|
| | YAG-based fluorescent material | Surface state | Volume composition ratio of material written on left side (vol. %) | Average grain diameter (μm) | Al$_2$O$_3$ volume composition ratio (vol. %) | Average diameter (μm) | Thickness (μm) |
| Comparative Example 11 | Y$_3$Al$_5$O$_{12}$ | Sintered surface | 100 | 6.4 | 0 | — | 31 |
| Comparative Example 12 | Y$_3$Al$_5$O$_{12}$ | Sintered surface | 27 | 2 | 73 | 4.9 | 55 |
| Example 44 | Y$_3$Al$_5$O$_{12}$ | Sintered surface | 27 | 2.1 | 73 | 4.9 | 54 |
| Example 45 | Y$_3$Al$_5$O$_{12}$ | Sintered surface | 27 | 2.2 | 73 | 5 | 55 |
| Comparative Example 13 | Y$_3$Al$_5$O$_{12}$ | Sintered surface | 27 | 2 | 73 | 4.8 | 52 |
| Comparative Example 14 | Y$_3$Al$_5$O$_{12}$ | Sintered surface | 27 | 2 | 73 | 4.6 | 51 |
| Example 46 | Y$_3$Al$_5$O$_{12}$ | Sintered surface | 27 | 2.4 | 73 | 5.1 | 50 |
| Example 47 | Y$_3$Al$_5$O$_{12}$ | Sintered surface | 27 | 2.5 | 73 | 5 | 50 |
| Comparative Example 15 | Y$_3$Al$_5$O$_{12}$ | Sintered surface | 27 | 2 | 73 | 4.6 | 55 |
| Example 48 | Y$_3$Al$_5$O$_{12}$ | Sintered surface | 18 | 4.2 | 82 | 5.9 | 50 |
| Example 49 | Y$_3$Al$_5$O$_{12}$ | Sintered surface | 22 | 2.3 | 78 | 5.4 | 53 |
| Example 50 | Y$_3$Al$_5$O$_{12}$ | Sintered surface | 35 | 1.9 | 65 | 3.2 | 55 |
| Example 51 | Y$_3$Al$_5$O$_{12}$ | Sintered surface | 40 | 1.8 | 60 | 4.2 | 53 |
| Comparative Example 16 | Y$_3$Al$_5$O$_{12}$ | Processed surface | 27 | 2 | 73 | 4.6 | 55 |
| Comparative Example 17 | Y$_3$Al$_5$O$_{12}$ | Sintered surface | 27 | 2.5 | 73 | 4.9 | 52 |
| Example 52 | Y$_3$Al$_5$O$_{12}$ | Sintered surface | 27 | 2.2 | 73 | 4.6 | 51 |
| Example 53 | Y$_3$Al$_5$O$_{12}$ | Sintered surface | 27 | 2 | 73 | 4.9 | 50 |
| Comparative Example 18 | Y$_3$Al$_5$O$_{12}$ | Sintered surface | 27 | 2.2 | 73 | 5 | 50 |
| Comparative Example 19 | Y$_3$Al$_5$O$_{12}$ | Processed surface | 27 | 2.3 | 73 | 5.2 | 51 |

| | | First layer | | | | |
|---|---|---|---|---|---|---|
| | Porosity (%) | Average surface roughness of 20 YAG:Ce grains: Ra1 (nm) | Average surface roughness of 20 Al$_2$O$_3$ grains: Ra2 (nm) | Average surface roughness from 10 points in entire sintered compact: Ra (μm) | Ra2/Ra1 (—) | Ce concentration after sintering (at %) |
| Comparative Example 11 | 0.2 | 0.3 | — | 0.16 | — | 2.9 |
| Comparative Example 12 | 0.2 | 0.3 | 0.4 | 0.2 | 1.33 | 2.7 |
| Example 44 | 0.2 | 0.3 | 0.4 | 0.2 | 1.33 | 3.1 |
| Example 45 | 0.2 | 0.3 | 0.4 | 0.2 | 1.33 | 3.1 |
| Comparative Example 13 | 1.5 | 0.3 | 0.4 | 0.2 | 1.33 | 3.1 |
| Comparative Example 14 | 0.2 | 0.1 | 0.1 | 0.05 | 1 | 3.1 |
| Example 46 | 0.2 | 0.2 | 0.3 | 0.1 | 1.33 | 3.1 |
| Example 47 | 0.2 | 0.5 | 0.7 | 0.50 | 1.33 | 3.1 |
| Comparative Example 15 | 0.2 | 0.8 | 1.0 | 0.8 | 1 | 3.1 |
| Example 48 | 0.4 | 0.3 | 0.4 | 0.3 | 1.33 | 3.1 |
| Example 49 | 0.3 | 0.3 | 0.4 | 0.3 | 1.33 | 3.1 |
| Example 50 | 0.3 | 0.3 | 0.4 | 0.2 | 1.33 | 3.1 |
| Example 51 | 0.2 | 0.3 | 0.4 | 0.2 | 1.33 | 3.1 |

TABLE 7-continued

|  | | | | | | |
|---|---|---|---|---|---|---|
| Comparative Example 16 | 0.2 | 0.01 | 0.01 | 0.01 | 1 | 3.1 |
| Comparative Example 17 | 0.2 | 0.1 | 0.1 | 0.05 | 1 | 3.1 |
| Example 52 | 0.2 | 0.2 | 0.3 | 0.1 | 1.33 | 3.1 |
| Example 53 | 0.2 | 0.5 | 0.7 | 0.5 | 1.33 | 3.1 |
| Comparative Example 18 | 0.2 | 0.8 | 1.0 | 0.8 | 1 | 3.1 |
| Comparative Example 19 | 0.2 | 0.01 | 0.01 | 0.01 | 1 | 3.1 |

TABLE 8

| | Intermediate layer (Al$_2$O$_3$) | | | |
|---|---|---|---|---|
| | Thickness (μm) | Ratio of number of grains with diameter of 20 to 300 μm (%) | Grain diameter min-max (μm) | Porosity (%) |
| Comparative Example 11 | 83 | 95 | 18-70 | 0.2 |
| Comparative Example 12 | 35 | 85 | 17-31 | 0.2 |
| Example 44 | 53 | 90 | 14-36 | 0.2 |
| Example 45 | 81 | 96 | 5-31 | 0.2 |
| Comparative Example 13 | 82 | 96 | 16-36 | 1.5 |
| Comparative Example 14 | 85 | 97 | 6-85 | 0.2 |
| Example 46 | 78 | 94 | 5-56 | 0.2 |
| Example 47 | 81 | 95 | 13-52 | 0.2 |
| Comparative Example 15 | 79 | 95 | 10-37 | 0.2 |
| Example 48 | 79 | 94 | 13-70 | 0.2 |
| Example 49 | 77 | 96 | 14-54 | 0.2 |
| Example 50 | 80 | 96 | 10-56 | 0.2 |
| Example 51 | 80 | 96 | 14-78 | 0.2 |
| Comparative Example 16 | 77 | 97 | 18-66 | 0.2 |
| Comparative Example 17 | 83 | 90 | 11-43 | 0.2 |
| Example 52 | 80 | 90 | 12-59 | 0.2 |
| Example 53 | 75 | 90 | 5-69 | 0.2 |
| Comparative Example 18 | 75 | 90 | 10-68 | 0.2 |
| Comparative Example 19 | 79 | 90 | 11-53 | 0.2 |

TABLE 9

| | Second layer | | | | | |
|---|---|---|---|---|---|---|
| | YAG-based material | Surface state | Volume composition ratio of material written on left side (vol. %) | Average grain diameter (μm) | Al$_2$O$_3$ volume composition ratio (vol. %) | Average grain diameter (μm) | Thickness (μm) |
| Comparative Example 11 | Y$_3$Al$_5$O$_{12}$ | Sintered surface | 28 | 2 | 72 | 5.4 | 247 |
| Comparative Example 12 | Y$_3$Al$_5$O$_{12}$ | Sintered surface | 27 | 2.5 | 73 | 5.4 | 247 |
| Example 44 | Y$_3$Al$_5$O$_{12}$ | Sintered surface | 27 | 2.5 | 73 | 5.4 | 265 |
| Example 45 | Y$_3$Al$_5$O$_{12}$ | Sintered surface | 27 | 2.1 | 73 | 4.6 | 253 |
| Comparative Example 13 | Y$_3$Al$_5$O$_{12}$ | Sintered surface | 27 | 2.1 | 73 | 4.7 | 206 |
| Comparative Example 14 | Y$_3$Al$_5$O$_{12}$ | Sintered surface | 27 | 2.1 | 73 | 4.6 | 253 |
| Example 46 | Y$_3$Al$_5$O$_{12}$ | Sintered surface | 27 | 2.2 | 73 | 5 | 253 |
| Example 47 | Y$_3$Al$_5$O$_{12}$ | Sintered surface | 27 | 2.1 | 73 | 5 | 253 |
| Comparative Example 15 | Y$_3$Al$_5$O$_{12}$ | Sintered surface | 27 | 2.4 | 73 | 4.7 | 253 |
| Example 48 | Y$_3$Al$_5$O$_{12}$ | Sintered surface | 18 | 3.9 | 82 | 5.2 | 254 |
| Example 49 | Y$_3$Al$_5$O$_{12}$ | Sintered surface | 22 | 2.8 | 78 | 5.1 | 251 |
| Example 50 | Y$_3$Al$_5$O$_{12}$ | Sintered surface | 35 | 3.1 | 65 | 4.8 | 256 |
| Example 51 | Y$_3$Al$_5$O$_{12}$ | Sintered surface | 40 | 3.2 | 60 | 5.2 | 241 |
| Comparative Example 16 | Y$_3$Al$_5$O$_{12}$ | Processed surface | 27 | 2.1 | 73 | 5.5 | 253 |

TABLE 9-continued

| | | | | | | | |
|---|---|---|---|---|---|---|---|
| Comparative Example 17 | Y₃Al₅O₁₂ | Sintered surface | 27 | 2.2 | 73 | 5.4 | 253 |
| Example 52 | Y₃Al₅O₁₂ | Sintered surface | 27 | 2.3 | 73 | 4.6 | 253 |
| Example 53 | Y₃Al₅O₁₂ | Sintered surface | 27 | 2.2 | 73 | 4.9 | 253 |
| Comparative Example 18 | Y₃Al₅O₁₂ | Sintered surface | 27 | 2.1 | 73 | 4.7 | 253 |
| Comparative Example 19 | Y₃Al₅O₁₂ | Processed surface | 27 | 2 | 73 | 4.7 | 253 |

| | Second layer | | | | |
|---|---|---|---|---|---|
| | Porosity (%) | Average surface roughness of 20 YAG: Ce grains: Ra1 (nm) | Average surface roughness of 20 Al₂O₃ grains: Ra2 (nm) | Average surface roughness from 10 points in entire sintered compact: Ra (μm) | Ce concentration after sintering (at %) |
| Comparative Example 11 | 0.2 | 0.2 | — | 0.3 | 0.2 |
| Comparative Example 12 | 0.2 | 0.3 | 0.4 | 0.2 | 0.3 |
| Example 44 | 0.2 | 0.3 | 0.4 | 0.2 | 0.0 |
| Example 45 | 0.1 | 0.3 | 0.4 | 0.2 | 0.1 |
| Comparative Example 13 | 1.5 | 0.3 | 0.4 | 0.2 | 0.0 |
| Comparative Example 14 | 0.2 | 0.1 | 0.1 | 0.05 | 0.1 |
| Example 46 | 0.2 | 0.2 | 0.3 | 0.1 | 0.1 |
| Example 47 | 0.2 | 0.5 | 0.7 | 0.50 | 0.1 |
| Comparative Example 15 | 0.2 | 0.8 | 1.0 | 0.8 | 0.0 |
| Example 48 | 0.2 | 0.3 | 0.5 | 0.2 | 0.1 |
| Example 49 | 0.2 | 0.3 | 0.4 | 0.2 | 0.0 |
| Example 50 | 0.2 | 0.3 | 0.5 | 0.2 | 0.1 |
| Example 51 | 0.2 | 0.4 | 0.5 | 0.2 | 0.0 |
| Comparative Example 16 | 0.2 | 0.01 | 0.01 | 0.01 | 0.1 |
| Comparative Example 17 | 0.2 | 0.1 | 0.1 | 0.05 | 0.0 |
| Example 52 | 0.2 | 0.2 | 0.3 | 0.1 | 0.0 |
| Example 53 | 0.2 | 0.5 | 0.7 | 0.50 | 0.1 |
| Comparative Example 18 | 0.2 | 0.8 | 1.0 | 0.8 | 0.0 |
| Comparative Example 19 | 0.2 | 0.01 | 0.01 | 0.01 | 0.2 |

TABLE 10

| | Connectivity between Al₂O₃ grains in each layer and each layer interface Yes • No | Fluorescent peak wavelength (nm) | Color unevenness σ(CIE_x) | Light emitting efficiency (—) |
|---|---|---|---|---|
| Comparative Example 11 | No | 544 | 0.0020 | 90 |
| Comparative Example 12 | Yes | 535 | 0.0009 | 98 |
| Example 44 | Yes | 548 | 0.0008 | 124 |
| Example 45 | Yes | 551 | 0.0004 | 152 |
| Comparative Example 13 | Yes | 549 | 0.0022 | 97 |
| Comparative example 14 | Yes | 547 | 0.0012 | 95 |
| Example 46 | Yes | 550 | 0.0006 | 121 |
| Example 47 | Yes | 549 | 0.0007 | 124 |
| Comparative Example 15 | Yes | 548 | 0.0021 | 145 |
| Example 48 | Yes | 550 | 0.0009 | 108 |
| Example 49 | Yes | 550 | 0.0006 | 131 |
| Example 50 | Yes | 547 | 0.0007 | 121 |
| Example 51 | Yes | 549 | 0.0009 | 103 |
| Comparative Example 16 | Yes | 550 | 0.0006 | 98 |
| Comparative Example 17 | Yes | 550 | 0.0004 | 94 |
| Example 52 | Yes | 551 | 0.0007 | 111 |
| Example 53 | Yes | 550 | 0.0004 | 119 |
| Comparative Example 18 | Yes | 549 | 0.0018 | 117 |
| Comparative Example 19 | Yes | 547 | 0.0005 | 96 |

From the above results, it was confirmed that, when the grains having a diameter of 20 μm to 300 μm is 90% or more of the total grain number in the intermediate layer formed of $Al_2O_3$ like Examples 44 to 53, the Ce (activator) concentration can be sufficiently lowered in the second layer after sintering so that diffusion of the Ce (activator) toward the second layer is suppressed.

Furthermore, like in Examples 44 to 53, when all of the first layer, the intermediate layer, and the second layer are composed of a sintered body having a porosity of 1.0% or less, the surface of the first layer and the second layer is a sintered surface which is exposed without processing, the calculated average roughness Ra as an average of 10 points measured with a measurement length of 4 mm is 0.1 μm to 0.5 μm, the calculated average roughness Ra1 of the YAG-based fluorescent material grains and YAG-based material exposed on a surface, which is obtained as an average of 20 points measured with a measurement length of 1 μm, is 0.2 nm to 0.5 nm, and the calculated average roughness Ra2 of the $Al_2O_3$ grains exposed on a surface, which is obtained as an average of 20 points measured with a measurement length of 1 μm, is 0.3 nm to 0.7 nm, it was confirmed that color unevenness of the exit light is suppressed and also the light emitting efficiency is excellent.

Furthermore, like in Examples 44 to 47, 49 to 50, 52, and 53, when the average diameter d1 of the 20 YAG-based fluorescent material grains containing an activator in the first layer and YAG-based material grains in the second layer is 0.5 μm to 5 μm, the average diameter d2 of the 20 $Al_2O_3$ grains in each of the first layer and the second layer is 1 μm to 10 μm, and in the first layer, the volume composition ratio of the YAG-based fluorescent material and $Al_2O_3$ is 22 volume % to 35 volume % and the ratio of the $Al_2O_3$ grains is in the range of 65 volume % to 78 volume %, and in the second layer, the volume composition ratio of the YAG-based material and $Al_2O_3$ is 22 volume % to 35 volume % and the ratio of the $Al_2O_3$ is 65 volume % to 78 volume %, it was confirmed that even higher light emitting efficiency is obtained.

What is claimed is:

1. A wavelength converting member comprising a plate-like sintered body having one principal surface as a light entrance surface and the other principal surface opposite to the entrance surface as a light exit surface, wherein
the plate-like sintered body has a porosity of 1.0% or less which includes fluorescent material grains containing an activator and light-transmitting material grains,
the fluorescent material containing the activator is a material represented by the general formula $A_3B_5O_{12}$:Ce, in the formula, A being at least one selected from the group consisting of Y and Gd, and B being Al,
the light-transmitting material is $Al_2O_3$ or a material in which at least $Sc_2O_3$ or $Ga_2O_3$ is contained in $Al_2O_3$,
at least the entrance surface and the exit surface are a non-processed sintered surface on which the fluorescent material grains and the light-transmitting material grains are exposed, and the non-processed sintered surface has a calculated average roughness Ra, as an average of 10 points measured with a measurement length of 4 mm, of 0.1 μm to 0.5 μm,
and the fluorescent material grains exposed on the non-processed sintered surface have a calculated average roughness Ra1, as an average of 20 points measured with a measurement length of 1 μm, of 0.2 nm to 0.5 nm, and the light-transmitting material grains exposed on the non-processed sintered surface have a calculated average roughness Ra2, as an average of 20 points measured with a measurement length of 1 μm, of 0.3 nm to 0.7 nm.

2. The wavelength converting member according to claim 1, wherein an average diameter d1 of the 20 fluorescent material grains is 0.5 μm to 5 μm, an average diameter d2 of the 20 light-transmitting material grains is 1 μm to 10 μm, an occupying ratio of the fluorescent material grains is 22 volume % to 35 volume %, and an occupying ratio of the light-transmitting material grains is 65 volume % to 78 volume %.

3. The wavelength converting member according to claim 2, wherein the average diameter d1 of the 20 fluorescent material grains is 0.1 times to 0.78 times smaller than the average diameter d2 of the 20 light-transmitting material grains.

4. The wavelength converting member according to claim 1, wherein the calculated average roughness Ra2 of the light-transmitting material grains exposed on the non-processed sintered surface, which is obtained as an average of 20 points measured with a measurement length of 1 μm, is 1.2 times to 2.0 times larger than the calculated average roughness Ra1 of the fluorescent material grains exposed on the non-processed sintered surface, which is obtained as an average of 20 points measured with a measurement length of 1 μm.

5. The wavelength converting member according to claim 3, wherein the calculated average roughness Ra2 of the light-transmitting material grains exposed on the non-processed sintered surface, which is obtained as an average of 20 points measured with a measurement length of 1 μm, is 1.2 times to 2.0 times larger than the calculated average roughness Ra1 of the fluorescent material grains exposed on the non-processed sintered surface, which is obtained as an average of 20 points measured with a measurement length of 1 μm.

6. A wavelength converting member comprising:
a first layer which contains a YAG-based fluorescent material containing an activator and $Al_2O_3$;
an intermediate layer which is laminated on the first layer and includes $Al_2O_3$ in which grains with a diameter of 20 μm to 300 μm include no less than 90% of total grain number; and
a second layer which is laminated on the intermediate layer and includes a YAG-based material containing an activator in an amount of no more than 10% of an activator content in the first layer and $Al_2O_3$, wherein
a connected structure is provided in which $Al_2O_3$ grains are connected to each other in each layer and $Al_2O_3$ grains are also connected to each other at each layer interface,
all of the first layer, the intermediate layer, and the second layer include a sintered body having a porosity of 1.0% or less, surfaces of the first layer and the second layer being a non-processed sintered surface, the non-processed sintered surface has a calculated average roughness Ra, as an average of 10 points measured with a measurement length of 4 mm, of 0.1 μm to 0.5 μm, and
a calculated average roughness Ra1 of the YAG-based fluorescent material grains exposed on the non-processed sintered surface, which is obtained as an average of 20 points measured with a measurement length of 1 μm, is 0.2 nm to 0.5 nm and a calculated average roughness Ra2 of $Al_2O_3$ grains exposed on the non-processed sintered surface, which is obtained as an average of 20 points measured with a measurement length of 1 μm, is 0.3 nm to 0.7 nm.

7. The wavelength converting member according to claim 6, wherein an average diameter d1 of 20 of the YAG-based fluorescent material grains containing an activator in the first layer and the YAG-based material grains in the second layer is 0.5 μm to 5 μm and an average diameter d2 of the 20 $Al_2O_3$ grains in each of the first layer and the second layer is 1 μm to 10 μm, and an occupying ratio of the YAG-based fluorescent material grains containing an activator in the first layer and the YAG-based material grains in the second layer is 22 volume % to 35 volume % in each of the first layer and the second layer, respectively, and an occupying ratio of the $Al_2O_3$ grains in each of the first layer and the second layer is 65 volume % to 78 volume %, respectively.

8. The wavelength converting member according to claim 7, wherein the YAG-based fluorescent material containing an activator that is contained in the first layer is $(Y_{1-s}Gd_s)_3(Al_{1-t}Ga_t)_5O_{12}$:Ce ($0 \leq s \leq 0.33$, $0 \leq t \leq 0.2$).

9. The wavelength converting member according to claim 7, wherein the YAG-based fluorescent material containing an activator that is contained in the first layer is $(Y_{1-x}Gd_s)_3(Al_{1-t}Ga_t)_5O_{12}$:Ce ($0 \leq s \leq 0.33$, $0 \leq t \leq 0.2$).

* * * * *